United States Patent
Economy et al.

(10) Patent No.: US 12,022,666 B2
(45) Date of Patent: Jun. 25, 2024

(54) MEMORY CELL STACK AND VIA FORMATION FOR A MEMORY DEVICE

(71) Applicant: Micron Technology, Inc., Boise, ID (US)

(72) Inventors: David Ross Economy, Boise, ID (US); Andrew Leslie Beemer, Sandy, UT (US)

(73) Assignee: Micron Technology, Inc., Boise, ID (US)

( * ) Notice: Subject to any disclaimer, the term of this patent is extended or adjusted under 35 U.S.C. 154(b) by 13 days.

(21) Appl. No.: 17/534,953

(22) Filed: Nov. 24, 2021

(65) Prior Publication Data

US 2022/0165793 A1     May 26, 2022

Related U.S. Application Data

(60) Division of application No. 16/746,645, filed on Jan. 17, 2020, now Pat. No. 11,189,662, which is a
(Continued)

(51) Int. Cl.
*H10B 63/00* (2023.01)
*H01L 21/321* (2006.01)
(Continued)

(52) U.S. Cl.
CPC ......... *H10B 63/80* (2023.02); *H01L 21/3212* (2013.01); *H01L 21/76802* (2013.01);
(Continued)

(58) Field of Classification Search
CPC .................................................. H10B 63/80
See application file for complete search history.

(56) References Cited

U.S. PATENT DOCUMENTS

| 5,594,698 A | 1/1997 | Freeman |
| 5,748,547 A | 5/1998 | Shau |

(Continued)

FOREIGN PATENT DOCUMENTS

| CN | 101165888 A | 4/2008 |
| CN | 104718576 A | 6/2015 |

(Continued)

OTHER PUBLICATIONS

Chinese Patent Office, "Office Action", issued in connection with Chinese Patent Application No. 202080093244.2 dated Jan. 3, 2023 (10 pages) (4 pages of English Translation and 6 pages of Original Document).

(Continued)

*Primary Examiner* — Caleb E Henry
(74) *Attorney, Agent, or Firm* — Holland & Hart LLP

(57) ABSTRACT

Methods, systems, and devices for via formation in a memory device are described. A memory cell stack for a memory array may be formed. In some examples, the memory cell stack may comprise a storage element. A via may also be formed in an area outside of the memory array, and the via may protrude from a material that surrounds the via. A material may then be formed above the memory cell stack and also above the via, and the top surface of the barrier material may be planarized until at least a portion of the via is exposed. A subsequently formed material may thereby be in direct contact with the top of the via, while a portion of the initially formed material may remain above the memory cell stack.

20 Claims, 14 Drawing Sheets

Related U.S. Application Data continuation-in-part of application No. 16/102,494, filed on Aug. 13, 2018, now Pat. No. 10,991,425.

(51) Int. Cl.

| | |
|---|---|
| *H01L 21/768* | (2006.01) |
| *H01L 23/522* | (2006.01) |
| *H01L 23/528* | (2006.01) |
| *H01L 23/532* | (2006.01) |
| *H10N 70/00* | (2023.01) |
| *H10N 70/20* | (2023.01) |

(52) U.S. Cl.
CPC .... *H01L 21/76819* (2013.01); *H01L 21/7684* (2013.01); *H01L 21/76843* (2013.01); *H01L 21/76877* (2013.01); *H01L 23/5226* (2013.01); *H01L 23/528* (2013.01); *H01L 23/53266* (2013.01); *H10N 70/231* (2023.02); *H10N 70/826* (2023.02); *H10N 70/841* (2023.02); *H10N 70/882* (2023.02)

(56) References Cited

U.S. PATENT DOCUMENTS

| | | | |
|---|---|---|---|
| 5,877,990 | A | 3/1999 | Kim |
| 6,225,226 | B1 | 5/2001 | Lee et al. |
| 9,012,319 | B1 | 4/2015 | Choi et al. |
| 9,530,737 | B1 | 12/2016 | Fu et al. |
| 9,577,010 | B2* | 2/2017 | Sciarrillo ............... H10B 63/32 |
| 10,147,875 | B1* | 12/2018 | Hansen ............. H01L 21/76834 |
| 10,374,039 | B1 | 8/2019 | Hashemi et al. |
| 10,459,657 | B2 | 10/2019 | Maheshwari et al. |
| 10,629,652 | B2* | 4/2020 | Bernhardt ............. H01L 23/528 |
| 10,658,583 | B1 | 5/2020 | Li et al. |
| 10,854,674 | B2* | 12/2020 | Ravasio ............... H10N 70/063 |
| 11,121,317 | B2 | 9/2021 | Venigalla et al. |
| 11,373,695 | B2 | 6/2022 | Swami et al. |
| 2001/0046784 | A1 | 11/2001 | Broekaart et al. |
| 2003/0027386 | A1 | 2/2003 | Lee |
| 2003/0076725 | A1 | 4/2003 | Hush |
| 2003/0218907 | A1 | 11/2003 | Yano |
| 2004/0084670 | A1 | 5/2004 | Tripsas et al. |
| 2005/0064707 | A1 | 3/2005 | Sinha |
| 2008/0106323 | A1 | 5/2008 | Aipperspach et al. |
| 2010/0038616 | A1 | 2/2010 | Nagashima et al. |
| 2010/0054030 | A1 | 3/2010 | Lowrey |
| 2010/0211725 | A1 | 8/2010 | Nagashima et al. |
| 2010/0284230 | A1 | 11/2010 | Shin |
| 2011/0186797 | A1 | 8/2011 | Herner |
| 2012/0156871 | A1 | 6/2012 | Sinha |
| 2013/0069233 | A1 | 3/2013 | Chou et al. |
| 2013/0095634 | A1* | 4/2013 | Takahashi ............ H10N 70/828 438/382 |
| 2014/0071756 | A1 | 3/2014 | Iwai et al. |
| 2014/0104926 | A1 | 4/2014 | Sutardja et al. |
| 2014/0157065 | A1 | 6/2014 | Ong |
| 2014/0175580 | A1 | 6/2014 | Chen et al. |
| 2014/0254272 | A1 | 9/2014 | Sharon et al. |
| 2015/0064899 | A1 | 3/2015 | Ji et al. |
| 2015/0255532 | A1 | 9/2015 | Li |
| 2015/0287916 | A1 | 10/2015 | Campbell et al. |
| 2017/0117327 | A1 | 4/2017 | Terai |
| 2017/0162627 | A1* | 6/2017 | Bernasconi ............ H10N 70/24 |
| 2017/0236779 | A1 | 8/2017 | Komori |
| 2017/0256309 | A1 | 9/2017 | Yoon |
| 2018/0261266 | A1 | 9/2018 | Harris et al. |
| 2018/0358411 | A1 | 12/2018 | Fantini et al. |
| 2019/0043807 | A1 | 2/2019 | Redaelli et al. |
| 2019/0043924 | A1 | 2/2019 | Conti et al. |
| 2019/0206455 | A1 | 7/2019 | Bedeschi et al. |
| 2019/0355411 | A1 | 11/2019 | Subramanian et al. |
| 2020/0051624 | A1* | 2/2020 | Economy ............. H10N 70/801 |
| 2020/0243642 | A1* | 7/2020 | Fukuo ................. H01L 29/0638 |
| 2020/0266338 | A1* | 8/2020 | Peng ..................... H10N 50/01 |
| 2020/0286822 | A1 | 9/2020 | Nishimura |
| 2020/0303300 | A1 | 9/2020 | Kato |
| 2020/0379655 | A1 | 12/2020 | Kajigaya |
| 2021/0013396 | A1* | 1/2021 | Wang ..................... H10N 50/85 |
| 2021/0091140 | A1 | 3/2021 | Ravasio et al. |

FOREIGN PATENT DOCUMENTS

| | | |
|---|---|---|
| CN | 106030842 A | 10/2016 |
| CN | 107078150 A | 8/2017 |
| CN | 107154274 A | 9/2017 |
| CN | 110660807 A | 1/2020 |
| JP | 2003-346485 A | 12/2003 |
| JP | 2006-505938 A | 2/2006 |
| JP | 2010-045205 A | 2/2010 |
| JP | 2012-235134 A | 11/2012 |
| JP | 2017-147337 A | 8/2017 |
| JP | 2019-515409 A | 6/2019 |
| JP | 2020-145311 A | 9/2020 |
| JP | 2020-155543 A | 9/2020 |
| JP | 2022-529568 A | 6/2022 |
| KR | 100881507 B1 | 2/2009 |
| KR | 10-2010-0055503 A | 5/2010 |
| WO | 2019/040304 A1 | 2/2019 |
| WO | 2019177632 A1 | 9/2019 |
| WO | 2019182657 A1 | 9/2019 |

OTHER PUBLICATIONS

European Patent Office, "Supplementary European search report," issued in connection with European Patent Application No. 20902537 dated Jan. 9, 2023 (7 pages).

International Search Report and Written Opinion received for PCT Patent Application No. PCT/US20/63414, dated Mar. 5, 2021, 7 pages.

Japan Patent Office, "Office Action," issued in connection with Japan Patent Application No. 2021-552543 dated Dec. 27, 2022 (11 pages) (6 pages of English Translation and 5 pages of Original Document).

Japanese Patent Office, "Office Action", issued in connection with Japanese Patent Application No. 2022-537274 dated Nov. 22, 2022 (15 pages) (8 pages of English Translation and 7 pages of Original Document).

ISA/KR< International Search Report and Written Opinion of the International Searching Authority, Int'l Appl. No. PCT/US2020/063415, dated Mar. 18, 2021, Korean Intellectual Property Office, Seo-gu, Daejeon, Republic of Korea, 11pgs.

Taiwan Intellectual Property Office, "Office Action," issued in connection with ROC (Taiwan) Patent Application No. 109143037, dated Sep. 10, 2021 (6 pages).

Chinese Patent Office, "Office Action," issued in connection with Chinese Patent Application No. 202110308268.1 dated Sep. 27, 2023 (14 pages total; 7 pages Original & 7 pages machine translation).

Chinese Patent Office, "Office Action," issued in connection with Chinese Patent Application No. 201910735747.4 dated Mar. 20, 2023 (16 pages) (8 pages of English Translation and 8 pages of Original Document).

Korean Patent Office, "Notice of Allowance," issued in connection with Korean Patent Application No. 10-2021-7028482 dated Aug. 1, 2023 (4 pages) (2 pages of English Translation and 2 pages of Original Document).

Japan Patent Office, "JP Decision to Grant," issued in connection with Japan Patent Application No. 2021-552543 dated Dec. 4, 2023 (5 pages) (2 pages of English Translation and 3 pages of Original Document).

* cited by examiner

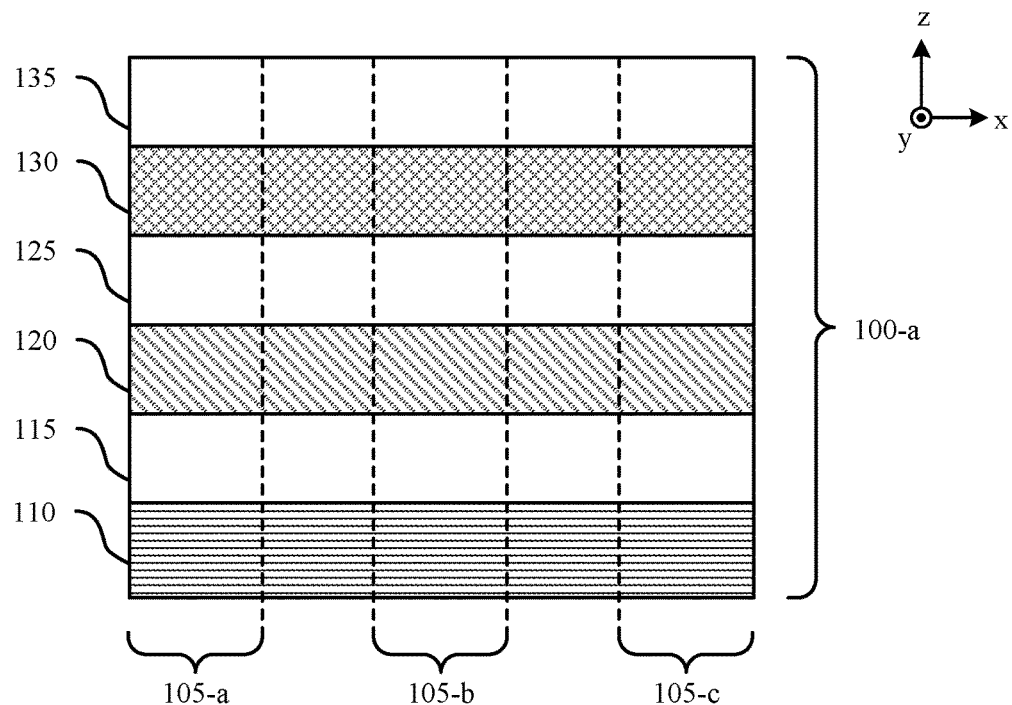
FIG. 1A
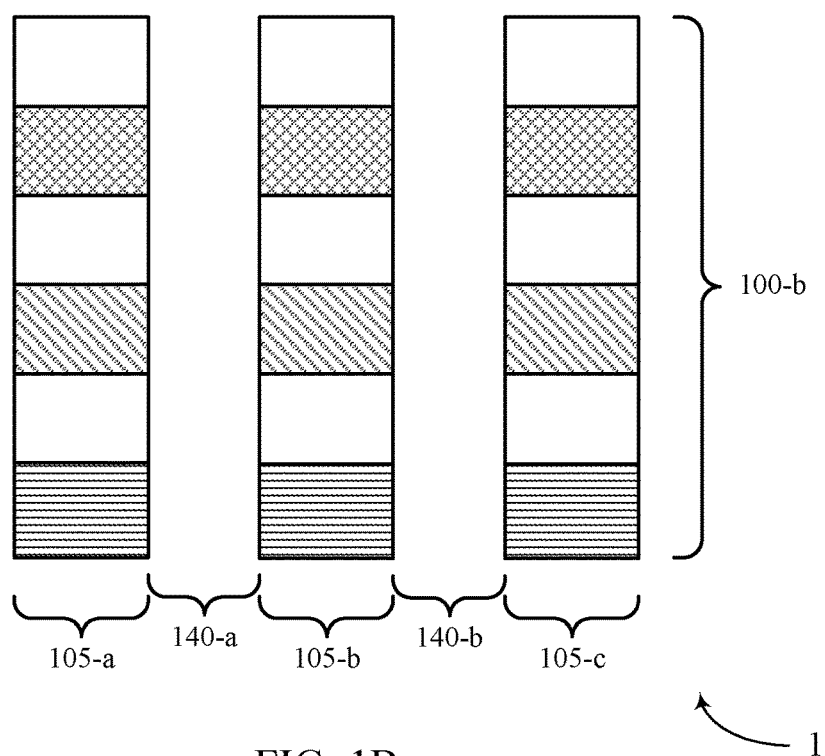
FIG. 1B
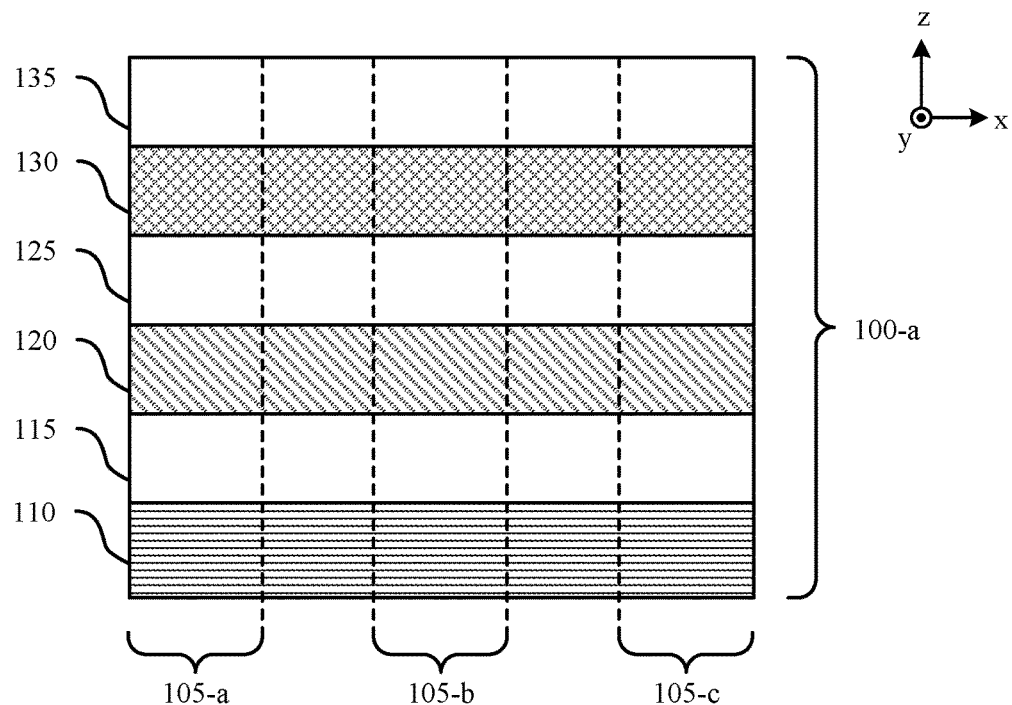 Selector Material   □ Electrode Material
 Metal Layer    Storage Material

| | Selector Material | | Storage Material | | Barrier Material |
|---|---|---|---|---|---|
| | Electrode Material | | Dielectric Material | | Metal Layer |

MEMORY CELL STACK AND VIA FORMATION FOR A MEMORY DEVICE

CROSS REFERENCES

The present Application for Patent is a divisional of U.S. patent application Ser. No. 16/746,645 by Economy et al., entitled "VIA FORMATION FOR A MEMORY DEVICE" and filed Jan. 17, 2020, which is a continuation-in-part of, claims the benefit of, and claims priority to currently pending U.S. patent application Ser. No. 16/102,494 by Economy et al., entitled "ACCESS LINE GRAIN MODULATION IN A MEMORY DEVICE" and filed Aug. 13, 2018, each of which is assigned to the assignee hereof and each of which is expressly incorporated by reference in its entirety herein.

BACKGROUND

The following relates generally to fabricating a memory cell stack in a cross-point memory array and more specifically to methods for access line grain modulation and via formation in a memory device.

Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source. Various types of memory architectures also exist. For example, an array of PCM memory cells may be arranged in a cross-point architecture to form a cross-point memory array.

BRIEF DESCRIPTION OF THE DRAWINGS

FIGS. 1A and 1B illustrate examples of fabrication techniques in accordance with embodiments of the present disclosure.

DETAILED DESCRIPTION

Figure 2A:
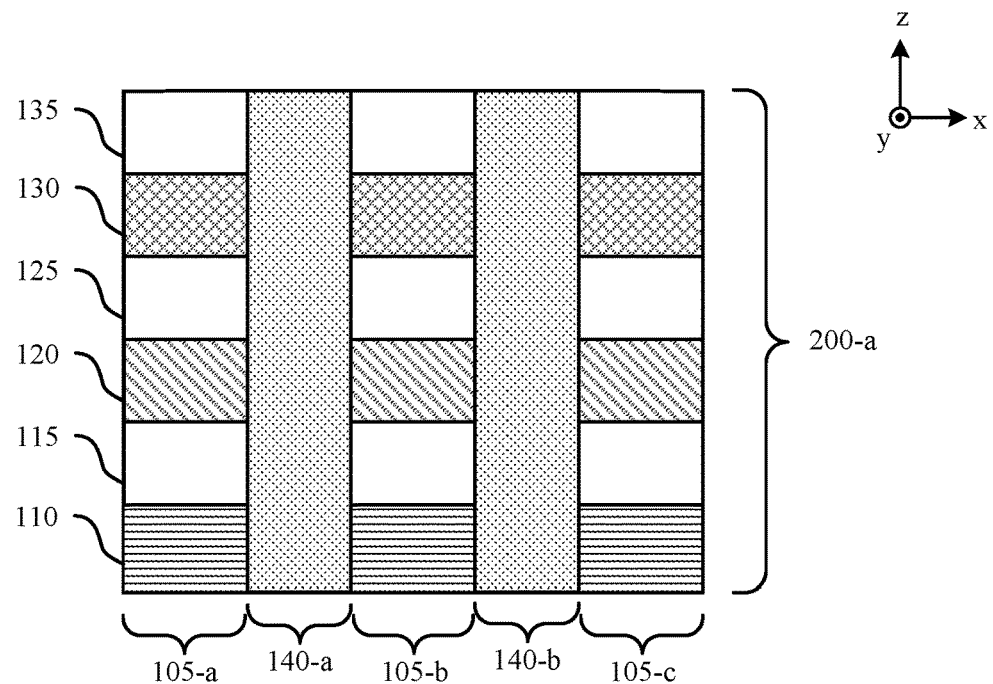
FIGS. 2A and 2B illustrate examples of fabrication techniques in accordance with embodiments of the present disclosure.

Some memory devices may be formed, at least in part, by forming a stack of various materials (e.g. a stack of materials may be formed and additional processing steps may be applied to the stack). In some cases, different layers of the stack may be formed sequentially, and thus the formation of the stack may involve forming an additional layer on top of a first layer of the stack. The structure of a top surface (e.g., a topography of the top surface) of the first layer may result in the additional layer having a similar structure (e.g., topography). For example, if the additional layer of the stack is formed in contact with a non-planar (e.g., undulating) top surface of the first layer, a non-planar or an undulating pattern of the first layer may propagate upwards to the additional layer, causing a non-planar or an undulating top surface in the additional layer as well.

The undulating top surface may impact the behavior of components that include one or both layers and/or components that include other layers above or on top of the undulating top surface of the additional layer. For example, the behavior of the material in a given layer or of the overall memory device (e.g., resistivity, current delivery, or both associated with a component of the memory device) may depend on (e.g., be impacted by) the presence of an undulating top surface of the additional layer. Thus, minimizing the undulations of one or more layers may improve the performance of the memory device for certain implementations.

In accordance with the teachings herein, fabricating a memory cell may include planarizing (e.g., polishing or otherwise smoothing) a layer prior to forming a next layer. For example, a barrier material may be fabricated using techniques that initially result in an undulating top surface of the barrier material (e.g., a top surface that is wavy or otherwise uneven in thickness or topography). In some cases, the barrier material may be planarized prior to forming a metal layer above the barrier material. Planarizing the barrier material prior to the metal layer formation may cause the resulting metal layer to lack or at least have reduced undulations (relative to undulations that may have existed in the metal layer had it been formed without an intermediate planarizing step of the barrier material). Therefore, the metal layer may have more predictable and uniform behavior or otherwise more desirable behavior.

For example, the grain size of the metal layer may increase, resulting in a decrease in resistivity in access lines formed from the metal layer and an increase in current delivery throughout the memory device. Increasing the grain size of the metal layer by planarizing the top surface of the barrier material may also reduce the complexity of memory device formation (e.g., the complexity of etch steps due a reduced amount of metal used to form access lines). These and other fabrication techniques described herein may thus improve the behavior and performance of memory cells and have other benefits which may be appreciated by those of ordinary skill in the art.

In some cases, vias may also be formed within the memory device. For example, vias may be formed of conductive material and may couple components at one layer of the memory device (e.g., access lines of an array of memory cells) to components at higher or lower layers of the memory device (e.g., to access line drivers that may be located below the memory cells). Vias may in some cases be formed over a first area of a substrate, which may be referred to as a via area, a via region, or a socket region, and a memory array may be formed over a second area of the substrate, which may be referred to as an array area or array region. The via area and the array area may be non-overlapping in some cases.

In some cases, aspects of memory device formation (such as, for example, the aspects that initially result in an undulating top surface of the barrier material) may result in a via at least temporarily (e.g., at least at one stage of fabrication) protruding from one or more materials surrounding the via, such that a top surface of the via is at least temporarily above a top surface of the one or more surrounding materials, with one or more sidewalls of the via exposed. For example, the via may be surrounded by (e.g., formed in) a dielectric material, and the via may at least temporarily protrude above a top surface of the dielectric material.

A material such as the barrier material described above may be deposited or otherwise formed so as to be above one or more memory cells of the array and also above one or more vias. The material may have benefits when included in the array area (e.g., a barrier material may have a beneficial impact on current characteristics for the memory cells, such as improved reset current characteristics), and for any number of reasons (e.g., cost, complexity), it may be impractical or otherwise undesirable to form the material only over the array area. For example, the barrier material may be formed as a blanket layer (sheet) over an area that includes both the via area and the array area, and potentially over an entire surface of a die or wafer.

Where a material is formed such that it initially covers the top surface of a via (e.g., a protruding portion of the via), planarizing the material prior to forming an additional layer may beneficially remove the material from above the via and allow the additional layer to be in direct contact with the via. For example, where a barrier material is formed above a protruding portion of a via, planarizing the barrier material may beneficially expose at least some portion of the via (e.g., a top surface of the via) such a subsequently formed access line may be in direct contact with the via. In such an example, the planarizing thus may decrease the resistance between the via and the access line relative to an implementation in which the barrier material remains above the via and thus between the via and the access line. Further, such a planarized material may remain above the array area (e.g., the planarizing may remove a portion of the material sufficient to expose an upper surface of the via but leave a remaining, lower, or less exposed, portion of the material), which may provide one or more associated benefits as described herein or as may otherwise be appreciated by one of ordinary skill in the art.

Features of the disclosure introduced above are further described below in the context of the example fabrication techniques of FIGS. 1-4 and 8-11. These and other features of the disclosure are further illustrated by and described with reference to the example memory array of FIG. 5 and the flowcharts of FIGS. 6 and 7 and FIGS. 12-14 that relate to the fabrication of memory cells and devices.

Various techniques may be used to form materials or components shown in 1-5 below. These may include, for example, chemical vapor deposition (CVD), metal-organic vapor deposition (MOCVD), physical vapor deposition (PVD), sputter deposition, atomic layer deposition (ALD), or molecular beam epitaxy (MBE), among other thin film growth techniques. Material may be removed using a number of techniques, which may include, for example, chemical etching (also referred to as "wet etching"), plasma etching (also referred to as "dry etching"), or chemical-mechanical planarization (CMP).

FIGS. 1A and 1B are schematic depictions of intermediate memory array structures illustrating a method of fabricating a memory cell stack at various stages of fabrication.

Referring to FIG. 1A, according to some examples, an intermediate array structure 100-*a* may include aspects of a cell stack that will be processed to eventually form a first memory cell stack 105-*a*, a second memory cell stack 105-*b*, and a third memory cell stack 105-*c*, as further detailed below. In some cases, the regions including the first memory cell stack 105-*a*, the second memory cell stack 105-*b*, and the third memory cell stack 105-*c* may eventually be configured (e.g., fabricated) to include three distinct memory cells (e.g., storage components within the memory cell stack 105). Thus, the data stored in the first memory cell may be independent of the data stored in the second and third memory cell, the data stored in the second memory cell may be independent of the data stored in the first and third memory cell, and the data stored in the third memory cell may be independent of the data stored in the first and second memory cell.

Although three memory cell stacks 105-*a*, 105-*b*, and 105-*c* are shown, one of ordinary skill will appreciate that, in practice, any number of memory cell stacks 105 may be formed. In some cases, fabricating the memory cell stacks 105 may include forming a metal layer 110 over a substrate (not shown). Metal layer 110 may be used to form one or more access lines, for example a word line or a bit line for a memory cell included in a memory cell stack 105.

In some cases, fabricating the memory cell stacks 105 may include forming a first electrode material 115 over metal layer 110. The first electrode material 115 may be used to form one or more bottom electrode components, for example bottom electrodes respectively corresponding to memory cell stacks 105-*a*, 105-*b*, and 105-*c*.

The method may include forming a selector material 120 over the first electrode material 115. The selector material 120 may be used to form one or more selection components, for example selector components respectively corresponding to memory cell stacks 105-*a*, 105-*b*, and 105-*c*. In some cases, the selector material 120 may comprise a chalcogenide material.

The method may include forming a second electrode material 125 over the selector material 120. The second electrode material 125 may be used to form one or more middle electrode components, for example middle electrodes respectively corresponding to memory cell stacks 105-*a*, 105-*b*, and 105-*c*.

The method may include forming a storage material 130 over the second electrode material 125. The storage material 130 may be used to form one or more storage components, for example storage components respectively corresponding to memory cell stacks 105-*a*, 105-*b*, and 105-*c*. In some cases, the storage material 130 may comprise a chalcogenide material. The storage material 130 may be the same as or different than the selector material 120. Also, though the example of intermediate array structure 100-a illustrates the storage material 130 as above the selector material 120, the positions of the storage material 130 and selector material 120 may be swapped in some examples. Further, in some examples, a memory cell stack 105 and corresponding memory cell stack may lack a separate selector material 120 and the second electrode material 125, and the storage material 130 may be self-selecting.

The method may include forming a third electrode material 135 over the storage material 130. The third electrode material 135 may be used to form one or more top electrode components, for example top electrodes respectively corresponding to memory cell stacks 105-a, 105-b, and 105-c.

Electrode materials 115, 125, and 135 may each include carbon. In some cases, one or more of electrode materials 115, 125, and 135 may consist of two sub-layers (not shown), and thus an electrode formed therefrom may be referred to as a bi-layer electrode. In this case, at least one sub-layer may include carbon and may be referred to as a carbon-based material. Electrode materials 115, 125, and 135 may be formed, for example, by deposition techniques such as PVD, CVD, or ALD, among other deposition techniques.

Each layer of intermediate array structure 100-a may be initially formed as a blanket layer over the surface area of an entire die or substrate, such as a wafer.

Referring now to intermediate array structure 100-b of FIG. 1B, isolation regions 140-a and 140-b may be formed between memory cell stacks 105-a and 105-b and/or 105-b and 105-c so as to separate and isolate the memory cell stacks 105 from one another. Isolation regions 140-a and 140-b may be formed using various etching or other removal techniques, which may use photomasks and photolithography to define the features as necessary.

FIG. 1B illustrates a cross-section of intermediate array structure 100-b in one plane (e.g., an x-z plane) and thus shows isolation regions 140-a and 140-b as separating memory cell stacks 105-a, 105-b, and 105-c in one dimension (e.g., the x dimension), but one of ordinary skill in the art will appreciate that like techniques may be applied in another plane (e.g., a y-z plane) so as to separate memory cell stacks 105-a, 105-b, and 105-c and the corresponding memory cell stacks in another dimension (e.g., the y dimension) such that the memory cell stacks corresponding to memory cell stacks 105-a, 105-b, and 105-c may each comprise a pillar. Further, one of ordinary skill in the art will appreciate that, in some cases, what may appear as separate isolation regions 140-a and 140-b in FIG. 1B may be conjoined in a different plane and thus may comprise one contiguous isolation region 140 in some alternatives.

Figure 2B:
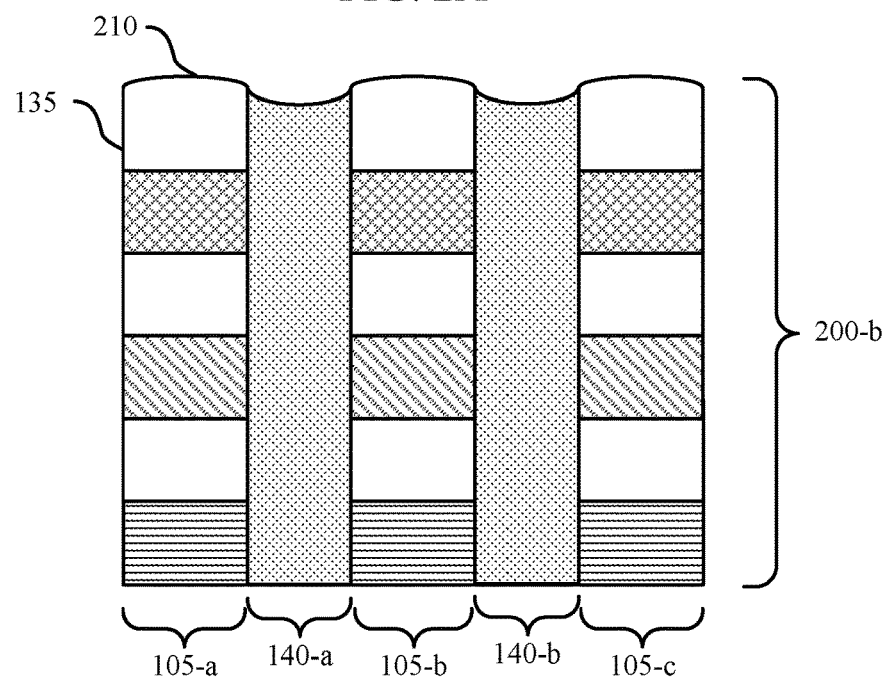

FIGS. 2A and 2B are schematic depictions of additional intermediate memory array structures illustrating a method of fabricating a memory cell stack.

Fabricating intermediate array structure 200-a of FIG. 2A may include depositing dielectric material 205. For example, isolation regions 140-a and 140-b may be filled with dielectric material 205. Thus, dielectric material 205 may be deposited and interposed between separate memory cell stacks. In that case, dielectric material 205 may surround one or more memory cell stacks 105.

Fabricating intermediate array structure 200-b of FIG. 2B may include forming an undulating surface 210. In some examples, undulating surface 210 may be referred to as a "wrap" topography and may be formed above third electrode material 135 and dielectric material 205. For example, undulating surface 210 may extend across at least some if not all of memory cell stacks 105-a, 105-b, and 105-c and isolation regions 140-a and 140-b. The wrap topography, which may be replicated in one or more layers above undulating surface 210, may in some cases improve the structural stability of memory cell stacks 105 and other aspects the memory array.

In some cases, undulating surface 210 may be formed by polishing or etching a top surface of third electrode material 135 and a top surface of dielectric material 205. In some examples, polishing or etching the top surface of third electrode material 135 and the top surface of dielectric material 205 may remove the third electrode material 135 and the dielectric material 205 at different rates. For example, the dielectric material 205 may be removed at a greater (faster) rate than the third electrode material 135, which may result in the undulating surface 210. Thus, in some examples, undulating surface 210 may be formed by removing third electrode material 135 at a first rate and/or removing dielectric material 205 at a second rate different than the first rate.

In certain examples, the undulating surface 210 may be formed by applying a CMP process to the top surface of the third electrode material 135 and dielectric material 205. In some cases, polishing the top surface of the third electrode material 135 may include breaking a vacuum seal associated with the deposition process. In this case, the third electrode material 135 may come to include oxidized carbon, as polishing intermediate array structure 200-b outside a vacuum environment may expose the top of the third electrode material 135 and dielectric material 205 to oxygen and/or the polishing process itself may introduce oxidation. In some other cases, fabricating the memory cell stack may not include the polishing of the third electrode material 135 and dielectric material 205, and the third electrode material 135 may not include oxidized carbon.

Figure 3A:
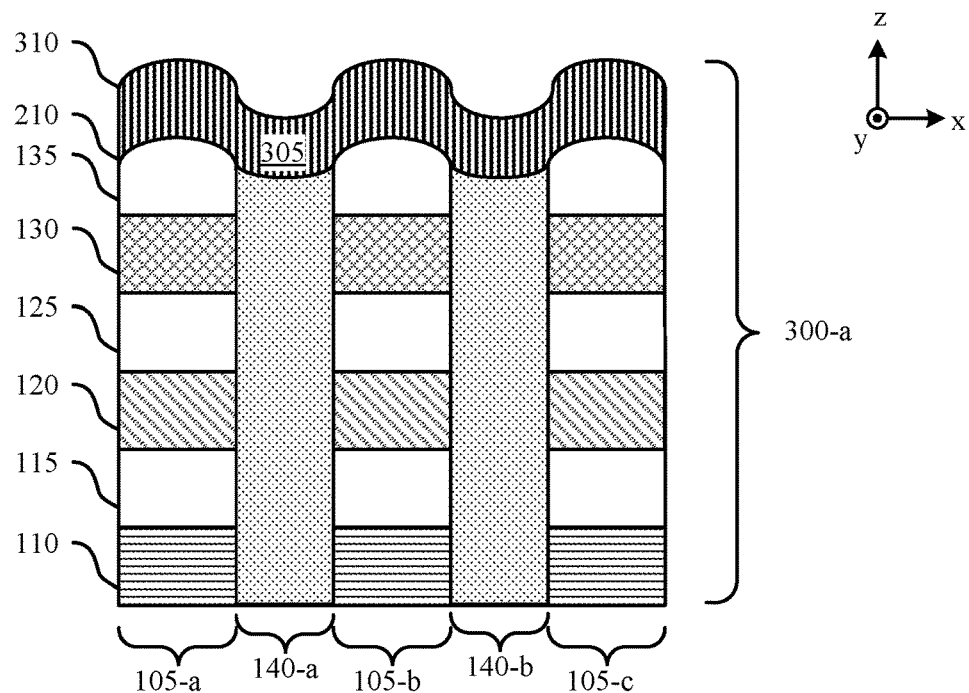
FIGS. 3A and 3B illustrate examples of fabrication techniques in accordance with embodiments of the present disclosure.
Figure 3B:
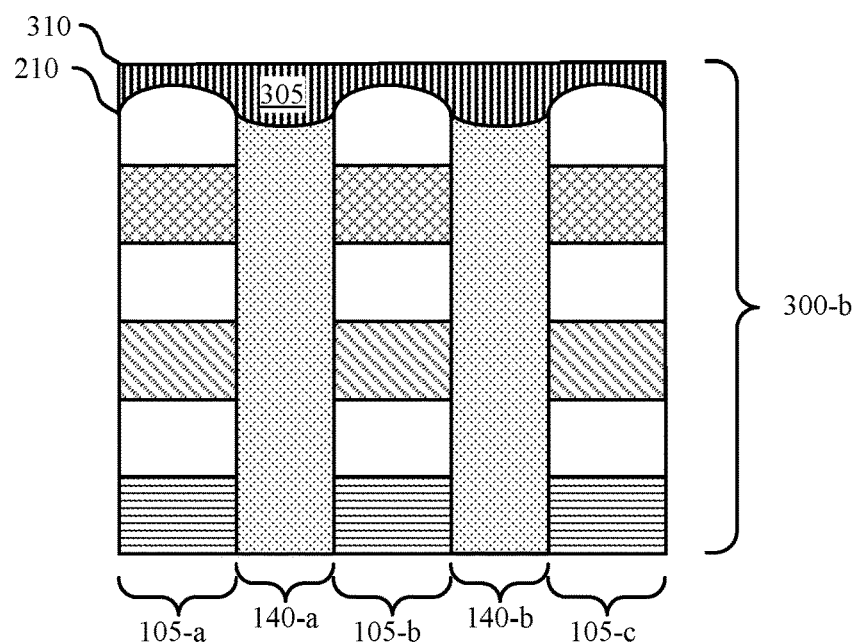

FIGS. 3A and 3B are schematic depictions of additional intermediate memory array structures illustrating a method of fabricating a memory cell stack with a barrier material 305. In some cases, barrier material 305 may be formed over the third electrode material 135 and the dielectric material 205 of intermediate array structure 300-a.

Intermediate array structure 300-a of FIG. 3A illustrates a deposition of barrier material 305 above the upper surface of the third electrode material 135 and above the upper surface of the dielectric material 205—that is, a deposition of barrier material 305 above the undulating surface 210 described with reference to FIG. 2B. In some cases, barrier material 305 may be in direct contact with third electrode material 135 and dielectric material 205. Various techniques may be used to deposit barrier material 305. These may include, but are not limited to, PVD, CVD, MOCVD, sputter deposition, ALD, or MBE, among other thin film growth techniques. In some cases, barrier material 305 may comprise a metal nitride such as tungsten nitride (WN), a metal silicide such as tungsten silicide (WSix), or a metal silicon nitride such as tungsten silicon nitride (WSiN). In some examples, barrier material 305 may be an example of a thermal barrier between the carbon of third electrode material 135 and a layer deposited on top of barrier material 305 (e.g., a metal layer as discussed below in further detail).

As initially formed, barrier material 305 may include a top surface 310 that is undulating. For example, barrier material 305 may be deposited on top of undulating surface 210. In some examples, as initially formed, barrier material 305 may include a uniform thickness in memory cell stacks 105-a, 105-*b*, and 105-*c* and isolation regions 140-*a* and 140-*b* and thus may include a top surface 310 with a similar undulating pattern as a bottom undulating surface (e.g., undulating surface 210) of barrier material 305.

Although not shown for clarity and ease of illustration, it will be understood that in some cases the illustrated array structures may also include a liner material deposited below barrier material 305. For example, the liner material may be interposed between a bottom surface of barrier material 305 and the top surface of third electrode material 135 and the top surface of dielectric material 205 (e.g., between a bottom surface of barrier material 305 and the undulating surface 210).

As illustrated in intermediate array structure 300-*b* of FIG. 3B, in some examples, the top surface 310 of barrier material 305 may be planarized or otherwise smoothened. Various techniques may be used to planarize top surface 310 of barrier material 305. These may include, but are not limited to, chemical etching, plasma etching, or polishing (e.g., CMP).

In some examples, processing the top surface 310 may change barrier material 305 from having a uniform thickness to having a varied thickness. For example, the thickness (e.g., a second thickness) of barrier material 305 in a region disposed above (e.g., overlapping with) a memory cell stack 105-*a* (e.g., second region or second type of region) may be less than the thickness (e.g., first thickness) of barrier material 305 in a region disposed above (e.g., overlapping with) an isolation region 140-*a* (e.g., first region). In some examples, the thickness of barrier material 305 may not impact the performance of the memory device so long as an interface corresponding to undulating surface 210 is maintained. For example, the lack of a thickness requirement or constraint may allow for flexibility in the planarization process, as discussed in reference to FIG. 3B.

Figure 4:
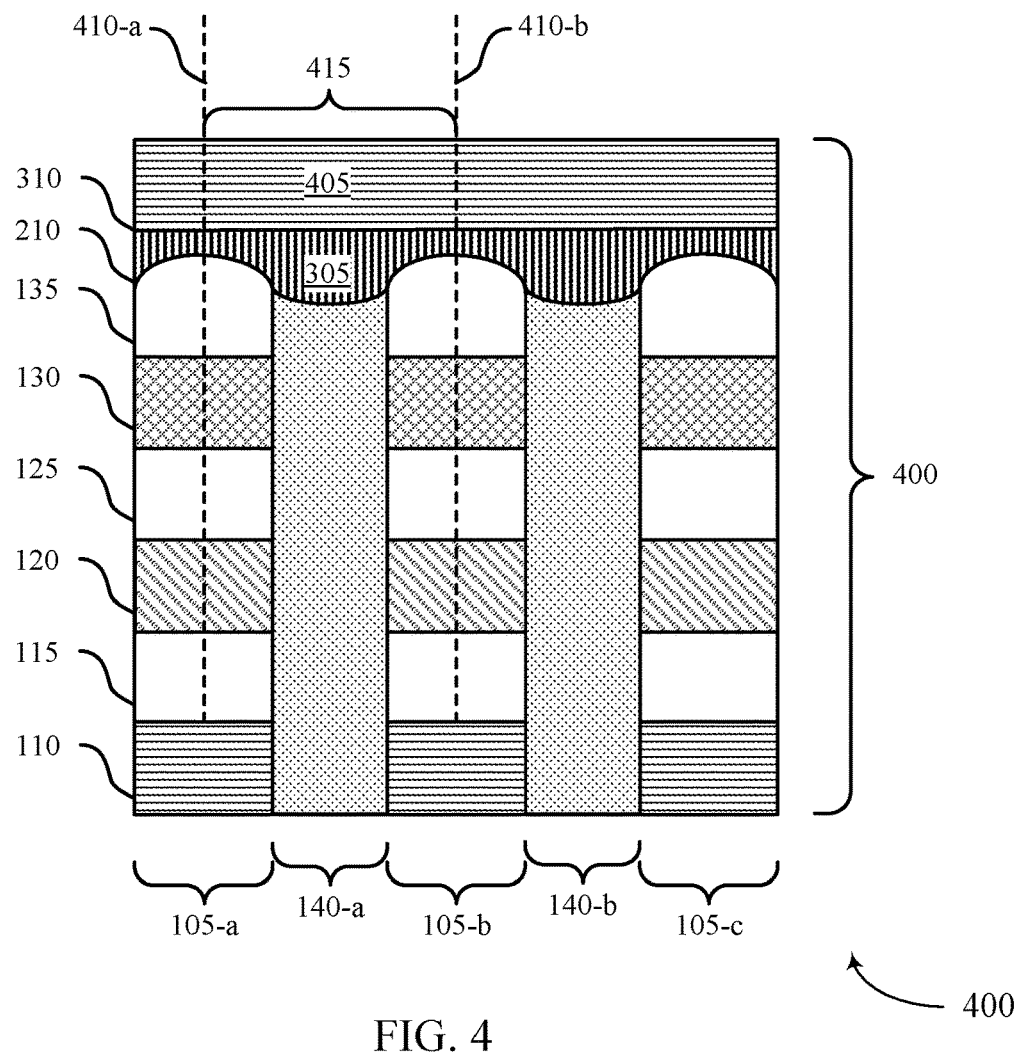
FIG. 4 illustrates an example of fabrication techniques in accordance with embodiments of the present disclosure.

FIG. 4 may be a schematic depiction of an additional intermediate memory array structure 400 illustrating a method of fabricating a memory cell stack with a metal layer 405. In some cases, the metal layer 405 may be formed over the barrier material 305 of intermediate array structure 400. In some cases, metal layer 405 may be in direct contact with top surface 310 (which may have been planarized or otherwise smoothened as described herein) of barrier material 305.

Intermediate array structure 400 of FIG. 4 illustrates a deposition of the metal layer 405 on a top surface 310 of barrier material 305. Various techniques may be used to deposit the metal layer 405. These may include, but are not limited to, PVD, CVD, MOCVD, sputter deposition, ALD, or MBE, among other thin film growth techniques. In some cases, metal layer 405 may be an example of an access line (e.g., word line, bit line, etc.). For example, metal layer 405 may comprise a refractory metal such as tungsten, tantalum, or molybdenum. In some cases, barrier material 305 (e.g., comprising WN, WSix, or WSiN) may provide reset current benefits or other benefits when deposited between third electrode material 135 (e.g., comprising carbon) and metal layer 405 (e.g., comprising tungsten, tantalum, or molybdenum).

In some cases, memory cell stack 105-*a* may include a center point 410-*a* and memory cell stack 105-*b* may include a center point 410-*b*. Center point 410-*a* and center point 410-*b* may be an example of a center of a memory cell stack. Distance 415 may be an example of a distance between center point 410-*a* and center point 410-*b*. For example, distance 415 may be an example of a cell pitch distance.

In some cases, absent planarization or other smoothening of metal layer 405, metal layer 405 may have an average grain size that substantially corresponds to (e.g., is substantially equal to) distance 415. For example, absent planarization or other smoothening of metal layer 405, the average grain size of metal layer 405 may substantially correspond to the topography of undulating surface 210, which may in turn substantially correspond to distance 415.

Where top surface 310 of barrier material 305 is planarized or otherwise smoothened as described herein, however, metal layer 405 may have an average grain size greater than distance 415 (e.g., greater than twice distance 415). For example, where top surface 310 of barrier material 305 is planarized or otherwise smoothened as described herein, a grain size of metal layer 405 may approach or be substantially equal to that observed for a blanket film deposition of the metal material included in metal layer 405 (e.g., approximately 250 nm or in some cases up to 300 nm or 350 nm, where metal layer 405 comprises tungsten, tantalum, or molybdenum). In some cases, increasing the average grain size in metal layer 405 may result in decreased resistance for access lines in the memory device, increased current delivery, and opportunities to reduce the thickness of metal layer 405. In some cases, planarizing top surface 310 of barrier material 305 may reduce the etch complexity of the memory device (e.g., as metal layer 405 may be formed using a decreased amount of metal) and increase structural yield of the memory device.

Although not shown for clarity and ease of illustration, it will be understood that the illustrated array structures may be formed above or below other layers (e.g., over a substrate), which can include, among other things, various peripheral and supporting circuitry. For example, complementary metal oxide semiconductor (CMOS) transistors may be incorporated into column and row driver circuitry and sense amplifier circuitry, as well as sockets and wiring that connect such circuitry to the memory array through the columns and rows described above. In addition, the other layers may include one or more memory arrays, or "decks" of arrays—the structures illustrated in the examples of FIGS. 1-4 may correspond to one deck of a memory array and may be above or below any number of additional decks of the memory array.

Although not shown for clarity and ease of illustration, it will be understood that the illustrated array structures may also include a conformal liner deposited adjacent to dielectric material 205 (e.g., in contact with dielectric material 205). For example, the conformal liner may be interposed between a side surface of dielectric material 205 and a side surface of the memory cell stack.

Though only processing in an x-z plane is shown and described with reference to FIGS. 1-4, one of ordinary skill in the art will appreciate that like processing may continue with like processes in another direction (e.g., as would be shown by a cross-section in a y-z plane). For example, memory array formation may continue with stack definition in an orthogonal (e.g., y) direction to form access lines from metal layer 415 as well as to create a pillar for each memory cell stack 105 and thereby isolation (insulate) electrodes, selector components, and storage components from adjacent memory cell stacks 105 from one another. Further, such processing steps as described with reference to FIGS. 1-4 may be repeated to form any number of levels of a memory device.

Figure 5:
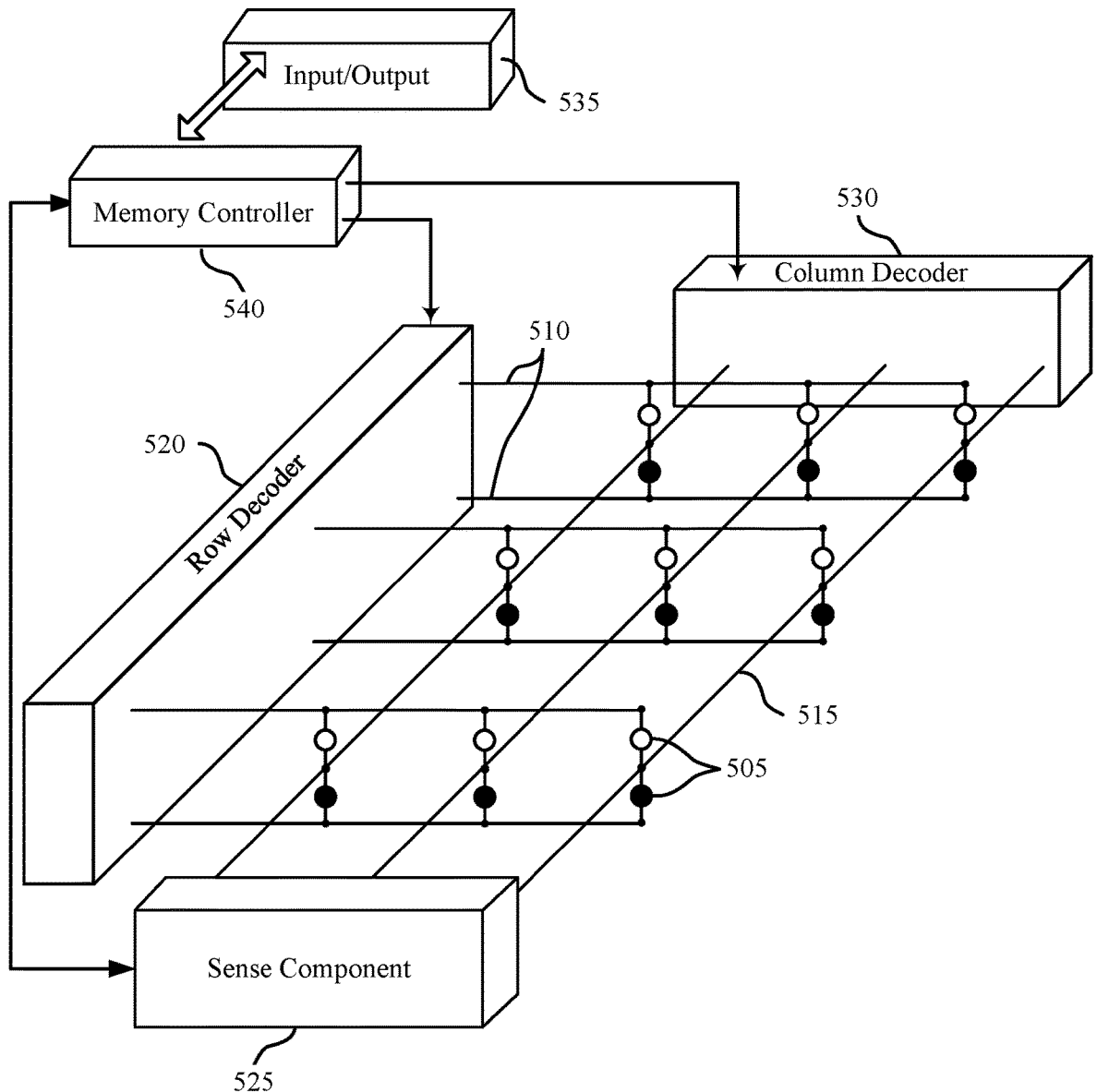
FIG. 5 illustrates an example memory array that supports access line grain modulation in a memory device in accordance with examples of the present disclosure.

FIG. 5 illustrates an example memory array 500 that supports access line grain modulation in a memory device in accordance with various examples of the present disclosure.

Memory array 500 may also be referred to as an electronic memory apparatus. Memory array 500 includes memory cell stacks 505 that are programmable to store different states. Each memory cell stack 505 may include one or more memory cells. In some cases, a memory cell stack 505 may be programmable to store one of two states, denoted a logic "0" and a logic "1." In some cases, a memory cell stack 505 may be configured to store one of more than two logic states. Memory cell stacks 505 may be examples of a memory cell stack 105 as described in reference to FIGS. 1-4.

Memory array 500 may be a three-dimensional (3D) memory array, where two-dimensional (2D) memory arrays are formed on top of one another. This may increase the number of memory cells that may formed on a single die or substrate as compared with 2D arrays, which in turn may reduce production costs or increase the performance of the memory array, or both. According to the example depicted in FIG. 5, memory array 500 includes two levels of memory cell stacks 505 and may thus be considered a three-dimensional memory array; however, the number of levels is not limited to two. Each level may be aligned or positioned so that memory cell stacks 505 may be approximately aligned with one another across each level.

Each row of memory cell stacks 505 is connected to an access line 510 and an access line 515. Access lines 510 and access lines 515 may be examples of or formed from corresponding metal layers 110 or metal layers 405, as described in reference to FIGS. 1-4. Access lines 510 and access lines 515 may also be known as word lines 510 and bit lines 515, respectively. Bit lines 515 may also be known digit lines 515. References to word lines and bit lines, or their analogues, are interchangeable without loss of understanding or operation.

Word lines 510 and bit lines 515 may be substantially perpendicular to one another to create an array. The two memory cell stacks 505 may share a common conductive line such as a digit line 515. That is, a digit line 515 may be in electronic communication with the bottom electrode of the upper memory cell stack 505 and the top electrode of the lower memory cell stack 505. Accordingly, in some cases a single access line 510, 515 may function as a word line 510 for a first group of one or more memory cell stacks 505 (e.g., a group of one or more memory cell stacks 505 below the access line 510, 515) and may function as a bit line 515 for a second group of one or more memory cell stacks 505 (e.g., a group of one or more memory cell stacks 505 above the access line 510, 515). Other configurations may be possible; for example, memory cell stack 505 may include asymmetrical electrode interfaces with the memory storage element. In some examples, the grain size of the access lines 510 and 515 may be increased by planarizing the top surface of a barrier material within the memory cell stack 505, as described herein, including with reference to FIGS. 1-4.

In general, one memory cell stack 505 may be located at the intersection of two conductive lines such as a word line 510 and a digit line 515. This intersection may be referred to as a memory cell's address. A target memory cell stack 505 may be a memory cell stack 505 located at the intersection of an energized word line 510 and digit line 515; that is, a word line 510 and digit line 515 may be energized in order to read or write a memory cell included in a memory cell stack 505 at their intersection. Other memory cell stacks 505 that are in electronic communication with (e.g., connected to) the same word line 510 or digit line 515 may be referred to as untargeted memory cell stacks 505.

As discussed above, electrodes (e.g., third electrode material 135 and first electrode material 115) may be coupled to a memory cell stack 505 and a word line 510 or a digit line 515, respectively. The term electrode may refer to an electrical conductor, and in some cases, may be employed as an electrical contact to a memory cell stack 505. An electrode may include a trace, wire, conductive line, conductive layer, or the like that provides a conductive path between elements or components of memory array 500.

Operations such as reading and writing may be performed on memory cell stacks 505 by activating or selecting a word line 510 and digit line 515, which may include applying a voltage or a current to the respective line. Word lines 510 and bit lines 515 may be made of conductive materials, such as metals (e.g., copper (Cu), aluminum (Al), gold (Au), tungsten (W), titanium (Ti), etc.), metal alloys, carbon, conductively-doped semiconductors, or other conductive materials, alloys, or compounds.

Accessing memory cell stacks 505 may be controlled through a row decoder 520 and a column decoder 530. For example, a row decoder 520 may receive a row address from the memory controller 540 and activate the appropriate word line 510 based on the received row address. Similarly, a column decoder 530 receives a column address from the memory controller 540 and activates the appropriate digit line 515. Thus, by activating a word line 510 and a digit line 515, a memory cell stack 505 may be accessed.

Upon accessing, a memory cell stack 505 may be read, or sensed, by sense component 525. For example, sense component 525 may be configured to determine the stored logic state of memory cell stack 505 based on a signal generated by accessing memory cell stack 505. The signal may include a voltage or electrical current, and sense component 525 may include voltage sense amplifiers, current sense amplifiers, or both. For example, a voltage may be applied to a memory cell stack 505 (using the corresponding word line 510 and digit line 515) and the magnitude of the resulting current may depend on the electrical resistance of the memory cell stack 505, which may reflect the logic state stored by the memory cell stack 505. Likewise, a current may be applied to a memory cell stack 505 and the magnitude of the voltage to create the current may depend on the electrical resistance of the memory cell stack 505, which may reflect the logic state stored by the memory cell stack 505. Sense component 525 may include various transistors or amplifiers in order to detect and amplify a signal, which may be referred to as latching. The detected logic state of memory cell stack 505 may then be output as output 535. In some cases, sense component 525 may be a part of column decoder 530 or row decoder 520. Or, sense component 525 may be connected to or in electronic communication with column decoder 530 or row decoder 520.

The memory controller 540 may control the operation (read, write, re-write, refresh, discharge, etc.) of memory cell stacks 505 through the various components, for example, row decoder 520, column decoder 530, and sense component 525. In some cases, one or more of the row decoder 520, column decoder 530, and sense component 525 may be co-located with the memory controller 540. Memory controller 540 may generate row and column address signals in order to activate the desired word line 510 and digit line 515. Memory controller 540 may also generate and control various voltages or currents used during the operation of memory array 500. For example, it may apply discharge voltages to a word line 510 or digit line 515 after accessing one or more memory cell stacks 505.

In general, the amplitude, shape, or duration of an applied voltage or current discussed herein may be adjusted or varied and may be different for the various operations discussed in operating memory array 500. Furthermore, one, multiple, or all memory cell stacks 505 within memory array 500 may be accessed simultaneously; for example, multiple or all cells of memory array 100 may be accessed simultaneously during a reset operation in which all memory cell stacks 505, or a group of memory cell stacks 505, are set to a single logic state.

Figure 6:
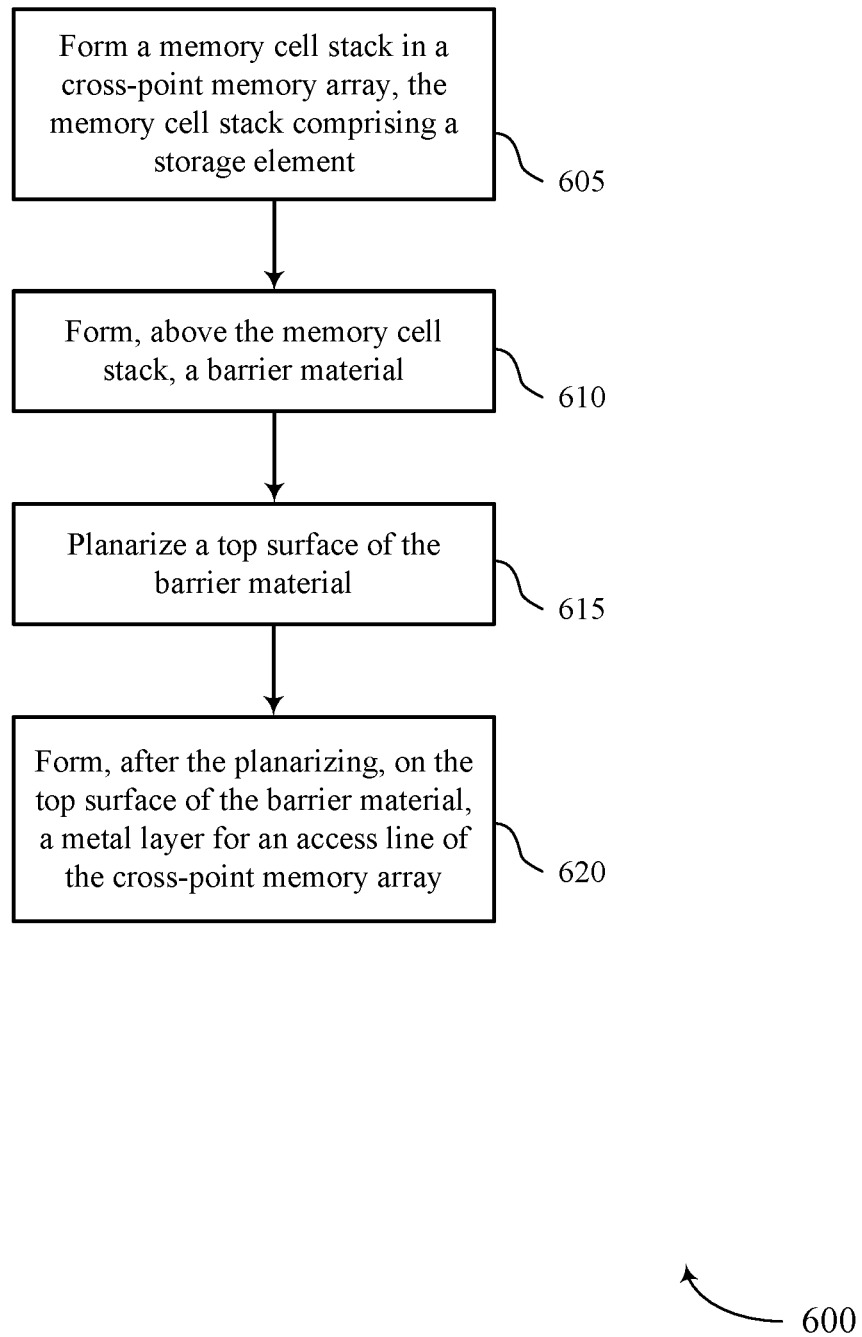
FIGS. 6 and 7 illustrate a method or methods for the access line grain modulation in a memory device in accordance with embodiments of the present disclosure.

FIG. 6 shows a flowchart illustrating a method 600 for access line grain modulation in a memory device in accordance with embodiments of the present disclosure. The operations of method 600 may be implemented in accordance with various fabrication techniques as described herein. For example, the operations of method 600 may be implemented by the fabrication techniques as discussed with reference to FIGS. 1-5.

At 605 a memory cell stack in a cross-point memory array may be formed. The memory cell stack may comprise a storage element. The operations of 605 may be performed according to the methods described herein. In certain examples, aspects of the operations of 605 may be performed using the fabrication techniques discussed with reference to FIGS. 1-5.

At 610 a barrier material may be formed above the memory cell stack. The operations of 610 may be performed according to the methods described herein. In certain examples, aspects of the operations of 610 may be performed using the fabrication techniques discussed with reference to FIGS. 1-5.

At 615 a top surface of the barrier material may be planarized. The operations of 615 may be performed according to the methods described herein. In certain examples, aspects of the operations of 615 may be performed using the fabrication techniques discussed with reference to FIGS. 1-5.

At 620 a metal layer for an access line of the cross-point memory array may be formed. In some cases, the metal layer may be formed on the top surface of the barrier material after the planarizing. In certain examples, aspects of the operations of 620 may be performed using the fabrication techniques discussed with reference to FIGS. 1-5.

In some examples, an apparatus may perform aspects of the fabrication described above using general-purpose or special-purpose hardware. The apparatus may include features, means, or instructions for forming a memory cell stack in a cross-point memory array, the memory cell stack comprising a storage element. The apparatus may further include features, means, or instructions for forming, above the memory cell stack, a barrier material. The apparatus may also include features, means, or instructions for planarizing a top surface of the barrier material. The apparatus may additionally include features, means, or instructions for forming, on the top surface of the barrier material, a metal layer for an access line of the cross-point memory array.

In some examples of the method and apparatus described above, planarizing the top surface of the barrier material may include applying a CMP process to the top surface of the barrier material. In some examples of the method and apparatus, forming the barrier material may include depositing the barrier material via a PVD process, a CVD process, an ALD process, or any combination thereof. In some cases, forming the memory cell stack may include forming an electrode layer, wherein the electrode layer comprises carbon. In some cases, forming the electrode layer may include depositing the electrode layer a PVD process, a CVD process, an ALD process, or any combination thereof.

Some examples of the method and apparatus described above may further include processes, features, means, or instructions for removing at least a portion of the electrode layer. In some examples of the method and apparatus described above, the metal layer is in contact with the top surface of the barrier material. In some cases, forming the memory cell stack may include depositing a dielectric material, wherein the dielectric material is interposed between the memory cell stack and a second memory cell stack. Some examples of the method and apparatus described above may further include processes, features, means, or instructions for removing a portion of the dielectric material and a portion of an electrode layer of the memory cell stack.

In some examples of the method and apparatus described above, removal of the electrode layer occurs at a first rate and removal of the dielectric material occurs at a second rate that is different than the first rate, where removing a portion of the dielectric material and a portion of the electrode layer forms an undulating surface below the barrier material. In some examples of the method and apparatus described above, the barrier material comprises WN, WSix, or WSiN and the metal layer for the access line comprises tungsten, tantalum, or molybdenum.

Figure 7:
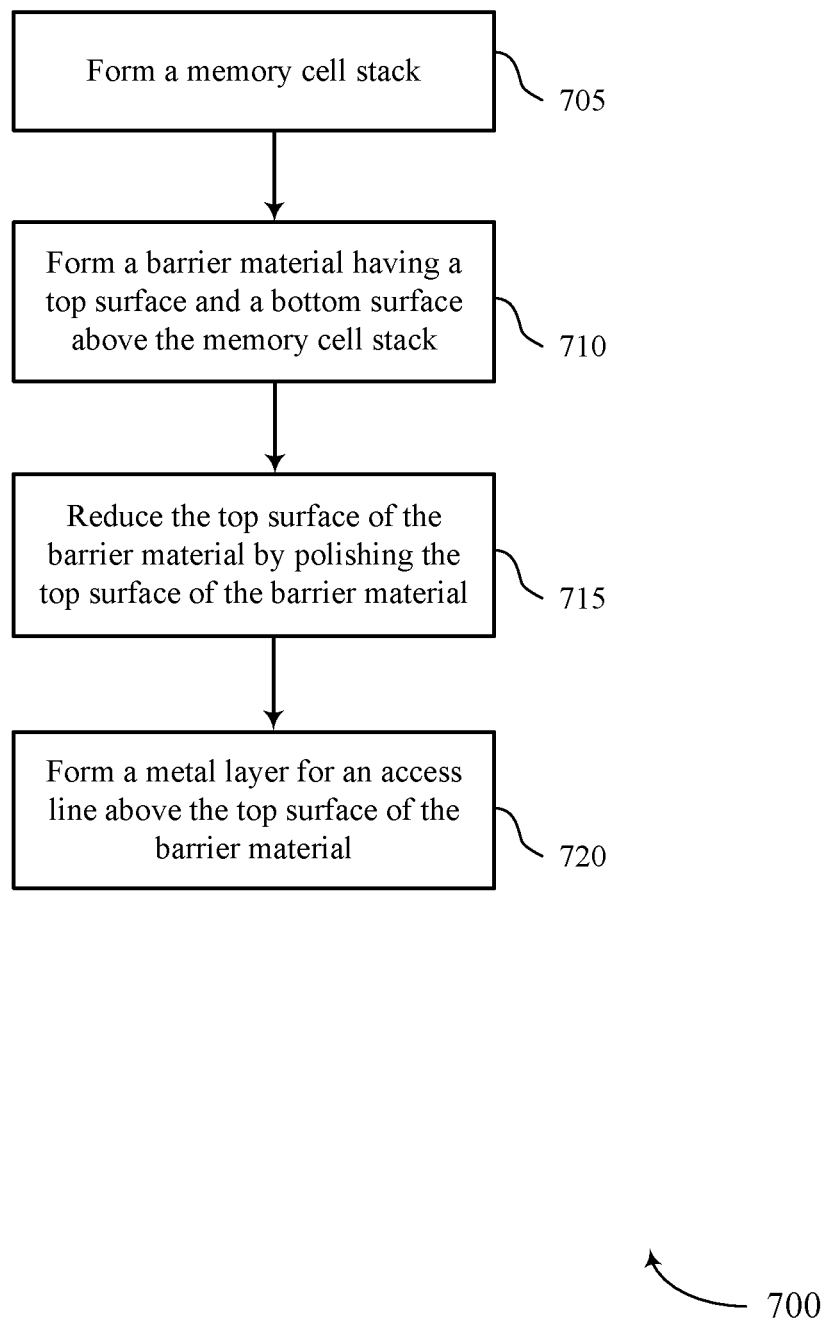

FIG. 7 shows a flowchart illustrating a method 700 for access line grain modulation in a memory device in accordance with embodiments of the present disclosure. The operations of method 700 may be implemented in accordance with various fabrication techniques as described herein. For example, the operations of method 700 may be implemented by the fabrication techniques as discussed with reference to FIGS. 1-5.

At 705 a memory cell stack may be formed. The operations of 705 may be performed according to the methods described herein. In certain examples, aspects of the operations of 705 may be using the fabrication techniques discussed with references to FIGS. 1-5.

At 710 a barrier material having a top surface and a bottom surface above the memory cell stack may be formed. The operations of 710 may be performed according to the methods described herein. In certain examples, aspects of the operations of 710 may be performed using the fabrication techniques discussed with reference to FIGS. 1-5.

At 715 the top surface of the barrier material may be reduced by polishing the top surface of the barrier material. The operations of 715 may be performed according to the methods described herein. In certain examples, aspects of the operations of 715 may be performed using the fabrication techniques discussed with reference to FIGS. 1-5.

At 720 a metal layer for an access line may be formed above the top surface of the barrier material. The operations of 720 may be performed according to the methods described herein. In certain examples, aspects of the operations of 720 may be performed using the fabrication techniques discussed with reference to FIGS. 1-5.

In some examples, an apparatus may perform aspects of the fabrication described using general-purpose or special-purpose hardware. The apparatus may include features, means, or instructions for forming a memory cell stack. The apparatus may additionally include features, means, or instructions for forming a barrier material having a top surface and a bottom surface above the memory cell stack. The apparatus may further include features, means, or instructions for reducing the top surface of the barrier material by polishing the top surface of the barrier material. The apparatus may further include features, means, or instructions for forming a metal layer for an access line above the top surface of the barrier material.

Some examples of the method and apparatus described above may further include processes, features, means, or instructions for etching a top surface of an electrode layer of the memory cell stack. Some examples of the method and apparatus described above may further include processes, features, means, or instructions for etching a top surface of a dielectric material interposed between the electrode layer and a second memory cell stack. Some examples of the method and apparatus described above may further include processes, features, means, or instructions for forming an undulating surface based at least in part on etching the top surface of the electrode layer and etching the top surface of the dielectric material.

Some examples of the method and apparatus described above may further include processes, features, means, or instructions for forming the barrier material on top of the undulating surface. In some examples of the method and apparatus described above, forming the barrier material may include forming an interface between an electrode layer of the memory cell stack and the bottom surface of the barrier material, wherein the interface has an undulation pattern. In some examples of the method and apparatus, reducing the top surface of the barrier material may include changing the barrier material from having a uniform thickness to having a varied thickness by applying a CMP process to the top surface of the barrier material.

It should be noted that the methods described above describe possible implementations, and that the operations and the steps may be rearranged or otherwise modified and that other implementations are possible. Further, embodiments from two or more of the methods may be combined.

In some cases, a device, system, or apparatus fabricated in accordance with various fabrication techniques as described herein may include a memory cell stack in a cross-point memory array, the memory cell stack comprising a storage element, a barrier material disposed above the memory cell stack, the barrier material comprising a planarized top surface, and a metal layer for an access line in contact with the planarized top surface of the barrier material.

In some examples of the device, system, or apparatus described above, the barrier material may comprise an undulating bottom surface. In some cases, the barrier material may have a first thickness in a first region above the memory cell stack and the barrier material may have a second thickness in a second region, where the second region is interposed between the first region and a third region that is above a second memory cell stack.

In some examples, the device, system, or apparatus may further include a dielectric material surrounding the memory cell stack, where the dielectric material has a top surface in contact with the barrier material, wherein the second region is above the dielectric material. In some cases of the device, system, or apparatus described above, the second thickness may be less than the first thickness.

In some examples, the barrier material may comprise a metal nitride such as WN, a metal silicide such as WSix, or a metal silicon nitride such as WSiN, and the metal layer may comprise a refractory metal such as tungsten, tantalum, or molybdenum. The device, system, or apparatus may also include an electrode layer within the memory cell stack, where the electrode layer has a top surface in contact with a bottom surface of the barrier material, wherein an interface between the top surface of the electrode layer and the bottom surface of the barrier material is separated from the metal layer by a varying distance. In some other examples, the electrode layer may comprise carbon.

In some examples, a center of the memory cell stack may be separated from a center of an immediately neighboring memory cell stack by a cell pitch distance. In some cases, the metal layer may have an average grain size greater than twice the cell pitch distance.

Figure 8A:
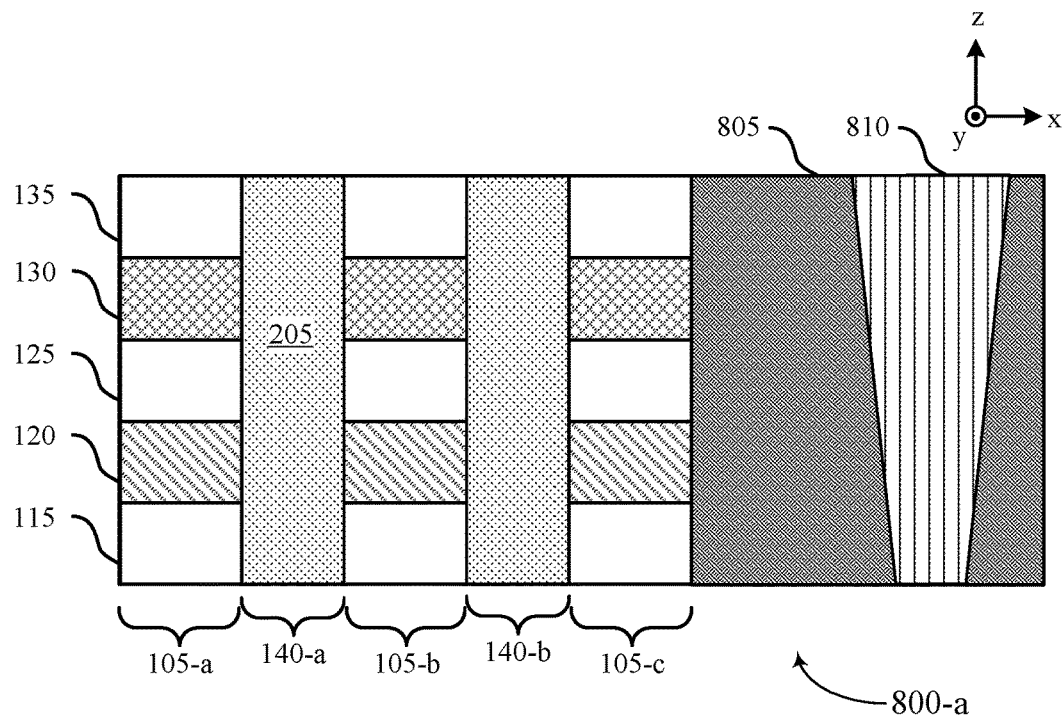
FIGS. 8A and 8B illustrate examples of fabrication techniques in accordance with embodiments of the present disclosure.
Figure 8B:
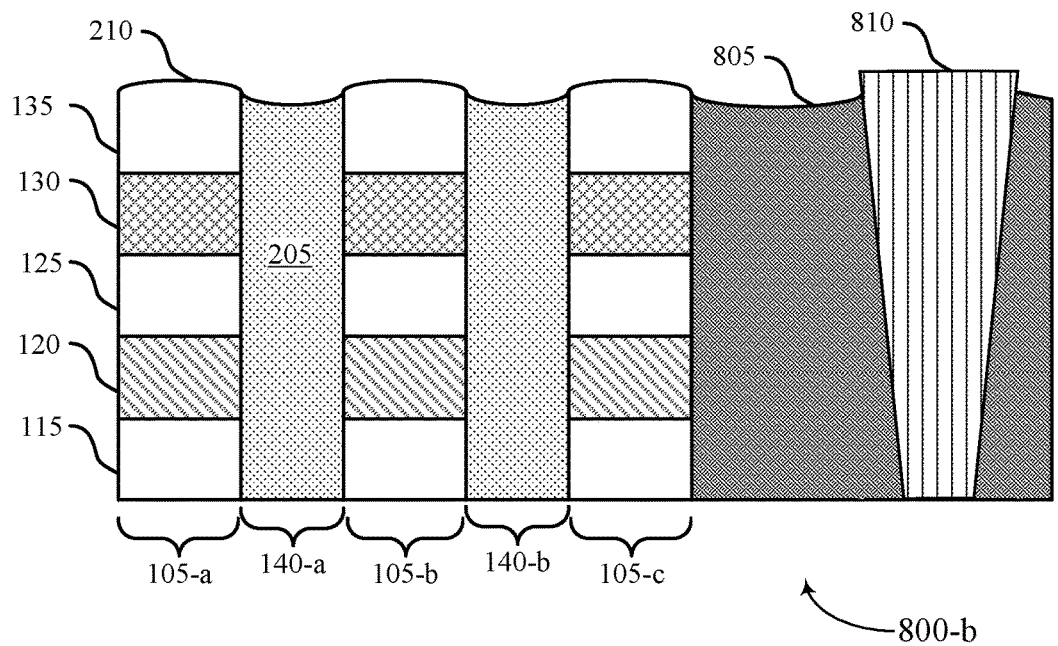

FIGS. 8A and 8B are schematic depictions of additional intermediate memory array structures illustrating methods of fabrication for a memory device.

Intermediate array structure 800-a of FIG. 8A may include aspects of intermediate array structure 200-a as described herein with reference to FIG. 2A. Intermediate array structure 800-a may further include dielectric material 805 and via 810. Dielectric material 805 may be formed in an area alongside (e.g., adjacent to) any number of memory cell stacks 105. For example, dielectric material 805 may be formed in a via area, which may be above a first area of a substrate, and memory cell stacks 105 may be formed in an array area, which may be above a second area of the substrate. In some cases, the first area and the second area of the substrate may be non-overlapping.

The space (region) within the memory device occupied by the dielectric material 805 may have previously included any number of other materials or structures, such as some or all of the materials included in memory cell stacks 105. For example, the layers of intermediate array structure 100-a as described herein with reference to FIG. 1A may have been formed as blanket layers or otherwise may have previously occupied the space occupied by the dielectric material 805. In some cases, additional memory cell stacks 105 may have previously been formed in the space occupied by the dielectric material 805.

The material or structures previously within the space occupied by the dielectric material 805 may have been etched away or otherwise removed using any suitable technique, such as the various removal techniques described herein. In some cases, the material or structures previously within the space occupied by the dielectric material 805 may have been removed based on a masking step that may be referred to as a chop mask, which may serve to define boundaries of array areas (and thus memory arrays) and via areas between or otherwise outside of array areas. Removing the material or structures previously within the space occupied by the dielectric material 805 may create a void (e.g., a trench) that may then be filed with the dielectric material 805. The dielectric material 805 may have been deposited or otherwise formed using any suitable technique, such as the various formation techniques described herein. In some examples, the dielectric material 805 may be a same material as the dielectric material 205 formed between memory cell stacks 105. In other examples, the dielectric material 805 may be a different material than the dielectric material 205 formed between memory cell stacks 105. For example, the dielectric material 805 may comprise an oxide, and the dielectric material 205 may comprise the same or a different oxide.

The via 810 may be formed by etching the dielectric material 805 to remove a portion of the dielectric material 805. The portion of the dielectric material 805 may be etched or otherwise removed using any suitable technique, such as the various removal techniques described herein. A space (e.g., hole, void) may thereby be formed within the dielectric material 805, and a via material then may be deposited or otherwise formed in the space to form the via 810. The via 810 thus may be surrounded by the dielectric material 805. Further, the dielectric material 805 (possibly along with any number of other materials) may be between the via 810 and the memory cell stacks 105. The via material may be tungsten (W), as one example. The space and thus the via 810 may extend through the dielectric material 805. In some cases, a top surface of the via 810 as initially formed may be the same (or at least substantially the same) height as a top surface of the dielectric material 805.

In some cases, the via 810 may be formed above any number other vias (not shown for clarity), which may be of aligned (e.g., coaxial) with the via 810 but included in (e.g., extending through) other layers below those shown in FIG. 8A. Thus, any number of vias 810 may be connected to collectively form an interconnect that passes through any number of layers within the memory device.

Also, though only one via 810 is shown for illustrative clarity, it is to be understood that any number of like or similar vias may be formed concurrently in the dielectric material 805. For example, a group of vias may be located in a same via region as the via 810 and at a same layer or level of the memory device (e.g., also formed within the dielectric material 805). Further, though the via 810 is described and illustrated as formed in and surrounded by the dielectric material 805, it is to be understood that the via 810 may alternatively be formed in or surrounded by any other type of material, including a collection of multiple materials.

Referring now to FIG. 8B, fabricating intermediate array structure 800-b may result in a portion of the via 810 protruding from the surrounding dielectric material 805. In some cases, the protruding portion may result from polishing or etching (e.g., applying a first planarization process to) a top surface of intermediate array structure 800-a (and thus a top surface of the dielectric material 805 and a top surface of the via 810) until the via 810 protrudes from the top surface of the dielectric material 805. In certain examples, the protruding portion of the via 810 may be formed by applying a CMP process to the top surface of the dielectric material 805 and via 810.

For example, polishing or etching the top surface of the dielectric material 805 and the top surface of the material included in the via 810 may remove the dielectric material 805 and the material included in the via 810 at different rates. For example, the dielectric material 805 may be removed at a greater (faster) rate than the material included in the via 810, which may result in the protruding portion of the via 810. Thus, in some examples, the protruding portion of the via 810 may be formed by removing the dielectric material 805 at a first rate and/or removing the material included in the via 810 at a second rate different than the first rate. In such cases, the height of the top surface of the via 810 (e.g., protruding portion) may become greater than the height of the top surface of the dielectric material 805 (e.g., because the top surface of the dielectric material 805 may decrease in height above the substrate by a relatively greater amount). Thus, in some cases, one or more sidewalls of the via 810 may be exposed and extend above the top surface of the dielectric material 805.

In some examples, the protruding portion of the via 810 may be formed as a result of one or more of the same processes that may result in the undulating surface 210 described above with reference to FIG. 2B and intermediate array structure 200-b. For example, a same CMP process that results in the undulating surface 210 may also cause the via 810 to protrude from the surrounding dielectric material 805.

Though the example of FIG. 8B illustrates the upper surface of the via 810 as above (higher than) the uppermost portions of the memory cell stacks 105, it is to be understood that, in other examples, the upper surface of the via 810 be at a same height or below (lower than) the uppermost portions of the memory cell stacks 105. For example, in some cases, the upper surface of the dielectric material 805 within the via region that includes the via 810 may be recessed (dished) (e.g., due to a polishing or etching process such as that described with reference to FIG. 2B) to a greater extent than the upper surface of the dielectric material 205 within an isolation region 140, and thus the via 810 may protrude from the dielectric material 805 without the upper surface via 810 necessarily being at a greater height than the uppermost portions of the memory cell stacks 105. In some cases, the via 810 may protrude from the dielectric material 805 even if the upper surface via 810 is at a lower height than the lowermost portions of the isolation regions 140.

Figure 9:
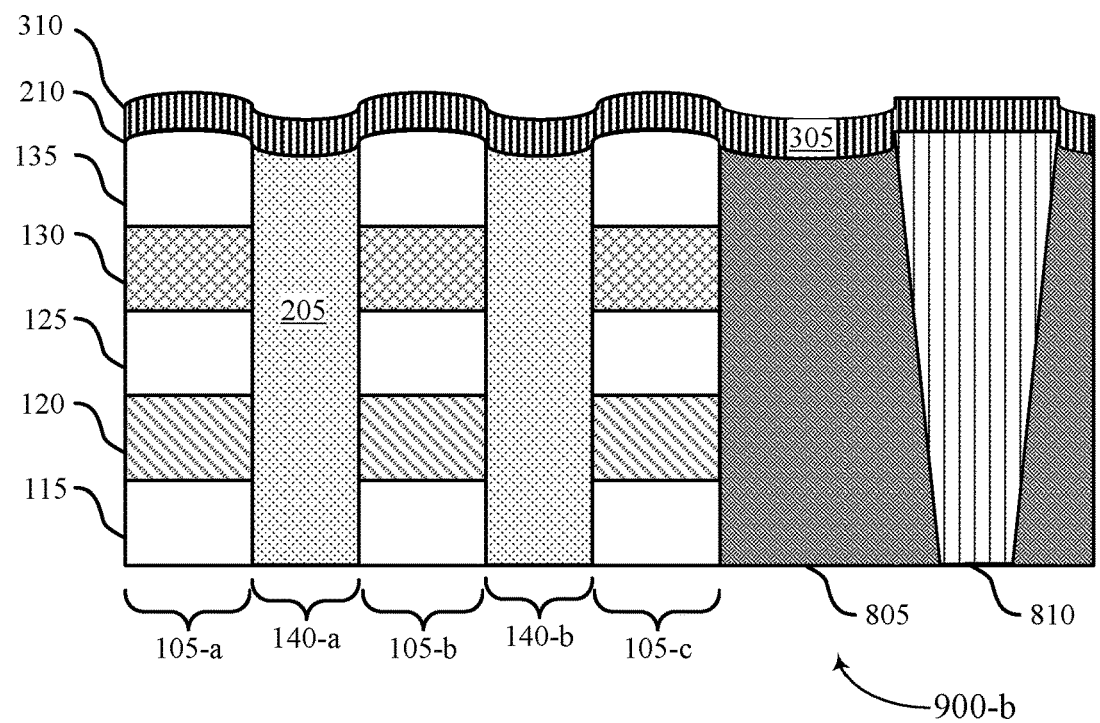
FIG. 9 illustrates an example of fabrication techniques in accordance with embodiments of the present disclosure.

FIG. 9 is a schematic depiction of an additional intermediate memory array structure 900 illustrating methods of fabrication for a memory device. In some cases, barrier material 305 may be formed over the via 810 of intermediate array structure 900, and possibly also over some or all of the third electrode material 135, the dielectric material 205, and the dielectric material 805 as illustrated in the example of intermediate array structure 900. Thus, in some cases, the barrier material 305 may be deposited above the undulating surface 210 described with reference to FIGS. 2B and 8B, and also above the dielectric material 805 and the via 810. Barrier material 305 may be deposited or otherwise formed as a blanket layer, for example, and thus may be in direct contact with the top surfaces of the third electrode material 135, dielectric material 205, dielectric material 805, and via 810.

Various techniques may be used to deposit barrier material 305. These may include, but are not limited to, PVD, CVD, MOCVD, sputter deposition, ALD, or MBE, among other thin film growth techniques. In some cases, barrier material 305 may comprise a nitride. For example, the barrier material 305 may comprise a metal nitride such as tungsten nitride (WN), a metal silicide such as tungsten silicide (WSix), or a metal silicon nitride such as tungsten silicon nitride (WSiN). It is to be understood, however, that the barrier material 305 may alternatively include any other suitable barrier material. In some examples, barrier material 305 may be an example of a thermal barrier between the carbon of third electrode material 135 and a layer deposited on top of barrier material 305 (e.g., a metal layer as discussed below in further detail).

As initially formed, barrier material 305 may include a top surface 310 that is undulating. For example, barrier material 305 may be deposited on top of undulating surface 210. In some examples, as initially formed, barrier material 305 may include a uniform thickness above memory cell stacks 105-a, 105-b, and 105-c, isolation regions 140-a and 140-b, the dielectric material 805, and the via 810. Thus, as initially formed, the barrier material 305 may include a top surface 310 that includes a similar undulating pattern as a bottom undulating surface (e.g., undulating surface 210) of barrier material 305. Additionally or alternatively, the top surface 310 of the barrier material 305 may mirror or otherwise have a similar topography as the profile of the top surfaces of the dielectric material 805 and the via 810, including the protruding portion of the via 810. For example, the barrier material 305 may be in contact with both the top surface of the via 810 as well as one or more (e.g., all) sidewalls of the via, or otherwise in contact with all surfaces of the protruding portion of the via 810).

The presence of the barrier material 305 above the array area (e.g., above the memory cell stacks 105 and isolation regions 140) may have one or more benefits as described elsewhere herein or as otherwise may be appreciated by one of ordinary skill in the art. As one example, the presence of the barrier material 305 above the array area may provide a reset current benefit or other electrical benefit related to programming the storage material 130 or otherwise operating the memory array that includes the memory cell stacks 105. As another example, the presence of the barrier material 305 above the array area may provide structural benefits related to undulating lower surface 210 and the use of a wrap topography. The presence of the barrier material 305 above the via 810 (e.g., above a via region), however, may have one or more drawbacks, such as increased resistance between the via 810 and any structure subsequently formed above the via 810 (e.g., a subsequently formed access line or other via 810 at a higher layer of the memory device) that is meant to be directly or indirectly coupled with the via 810.

Figure 10:
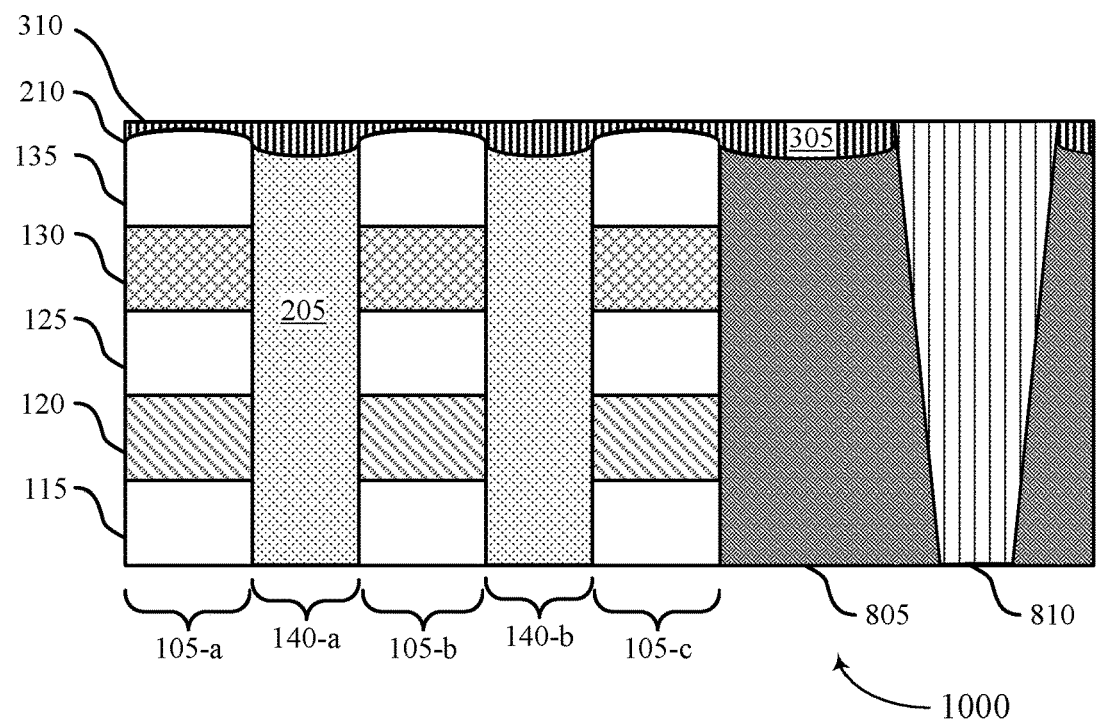
FIG. 10 illustrates an example of fabrication techniques in accordance with embodiments of the present disclosure.

FIG. 10 is a schematic depiction of an additional intermediate memory array structure 1000 illustrating methods of fabrication for a memory device. As illustrated in intermediate array structure 1000, in some examples, after the barrier material 305 is formed, the top surface 310 of barrier material 305 may be planarized or otherwise smoothened. Various techniques may be used to planarize top surface 310 of barrier material 305. These may include but are not limited to CMP. In some examples, top surface 310 of barrier material 305 may be planarized using of one or more of the same processes described above with reference to FIG. 3B and intermediate array structure 300-b. For example, a same CMP process may be used to planarize or otherwise smoothen the surface 310 of barrier material 305 above the memory cell stacks 105 and dielectric material 205 (e.g., above an array area) as well as above the via 810 and the dielectric material 805 (e.g., above a via area).

In some cases, a top surface of the barrier material 305 may be polished or otherwise processed (e.g., removed) until at least a top surface of the protruding via 810 is exposed. The barrier material 305 may remain above the memory cell stacks 105 and isolation regions 140 (e.g., above an array area) after the planarization process, and in some cases also above the dielectric material 805. For example, the barrier material 305 may remain above other aspects of the intermediate array structure 1000-b after the planarization process because the thickness of the barrier material 305 as initially formed (e.g., as described with reference to FIG. 9) is greater than an amount by which the via 810 protrudes from the dielectric material 805 (e.g., greater than a height of one or more sidewalls of the protruding portion of the via 810).

Though the example of FIG. 10 illustrates the upper surface of the via 810 as above (higher than) the uppermost portions of the memory cell stacks 105, it is to be understood that, in other examples, the upper surface of the via 810 be at a same height or below (lower than) the uppermost portions of the memory cell stacks 105 or even the lowermost portions of the isolation regions 140, as explained above with reference to FIG. 8, for example. In at least some such examples, the polished (smoothened) upper surface 310 of the barrier material 305 may not be globally at a same height above the array area and above the via area.

In some cases, after planarization, the barrier material 305 may remain in contact with at least a portion of one or more sidewalls of the via 810. For example, a sidewall of the protruding portion of the via 810 may remain in contact with the barrier material 305. The barrier material 305 also may remain above the dielectric material 805. In such cases, a portion of the via 810 may come to be surrounded, at least in part, by the barrier material. Though the example of FIG. 10 shows the top surface of the via 810 as being level with the top surface of the barrier material 305, it is to be understood that in some cases the via 810 may come to protrude from the top surface of the barrier material 305 through similar mechanisms as described with respect the via 810 coming to protrude from the dielectric material 805 with reference to FIG. 8B.

Removing (or at least decreasing) the undulations in the upper surface 310 of the barrier material 305 may have one or more benefits as described elsewhere herein or as otherwise may be appreciated by one of ordinary skill in the art, such as eliminating (or at least reducing) undulations in layer subsequently formed above the barrier material and thereby promoting larger grain size in subsequently formed access lines. Further, removing the barrier material 305 from above the via 810 may decrease resistance between the via 810 and any structure subsequently formed above the via 810 (e.g., a subsequently formed access line or other via 810) that is directly or indirectly coupled with the via 810, while avoiding additional costs, complexities, or other drawbacks that may be associated with forming the barrier material 305 so as to not initially cover the via 810.

Although not shown for clarity and ease of illustration, it will be understood that in some cases the illustrated array structures may also include a liner or other additional material formed below barrier material 305 (e.g., as a blanket layer). For example, the liner material may be interposed between a bottom surface of barrier material 305 and the top surface of third electrode material 135 and the top surface of dielectric material 205 (e.g., between a bottom surface of barrier material 305 and the undulating surface 210). In some examples, as initially formed, the liner material may be interposed between a bottom surface of barrier material 305 and the top surface of the via 810 as well as the top surface of the dielectric material 805. The liner material may be removed from above the top surface of the via 810 using the same or similar processing operations as those described for removing the barrier material 305 from above the top surface of the via.

Figure 11:
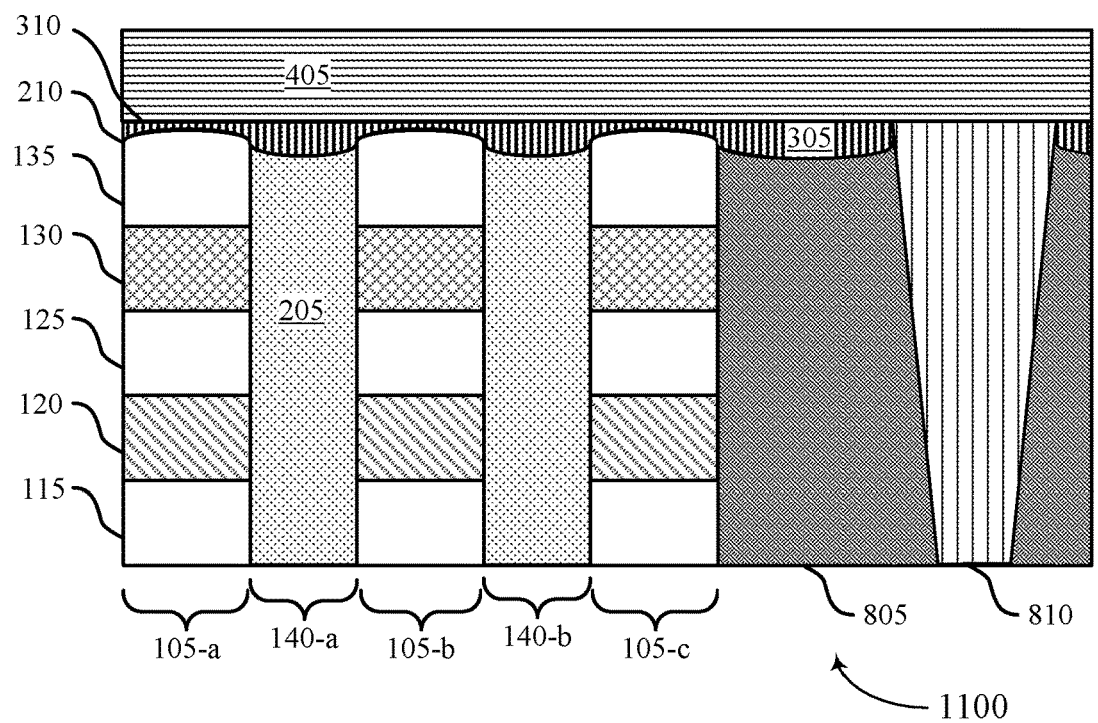
FIG. 11 illustrates an example of fabrication techniques in accordance with embodiments of the present disclosure
Figure 11:
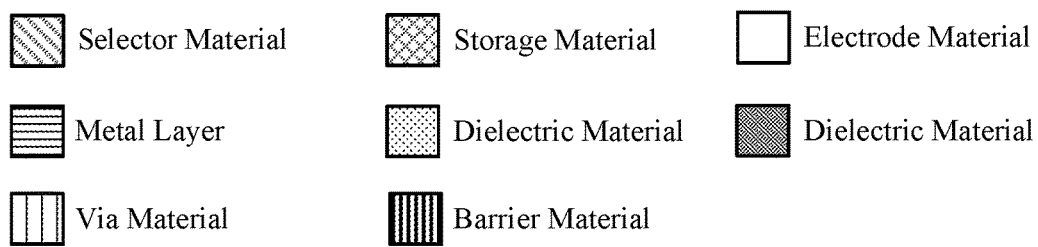

FIG. 11 is a schematic depiction of an additional intermediate memory array structure 1100 illustrating methods of fabrication for a memory device. In some cases, a metal layer 405 may be formed over the barrier material 305. For example, metal layer 405 may be in direct contact with top surface 310 (which may have been planarized or otherwise smoothened as described herein) of barrier material 305. In some examples, metal layer 405 may be in direct contact with the via 810. For example, the metal layer 405 may extend from above the memory cell stacks to above the via (e.g., the metal layer 405 may be deposited or otherwise formed as a blanket layer).

In some such cases, due to having previously removed the barrier material 305 from the top surface of the via 810, the metal layer 405 may be in contact with the top surface of the via 810. The direct contact between the metal layer 405 and the via 810 may support a reduced contact resistance, thereby improving the overall memory device performance. For example, an access line (e.g., a bit line or a word line for the memory cells corresponding to memory cell stacks 105-a, 105-b, and 105-c) may subsequently be formed from metal layer 405, and the access line may be in direct contact with the via 810, thereby reducing resistance between the access line and the via 810, and thus between the access line and any other structure that may be coupled with the via 810 (e.g., a driver for the access line). These and other fabrication techniques described herein may thus improve the behavior and performance of memory cells along with other benefits that may be appreciated by those of ordinary skill in the art.

Various techniques may be used to form the metal layer 405. These may include, but are not limited to, PVD, CVD, MOCVD, sputter deposition, ALD, or MBE, among other thin film growth techniques. In some cases, metal layer 405 may comprise a refractory metal such as tungsten, tantalum, or molybdenum. In some cases, the barrier material 305 (e.g., comprising WN, WSix, or WSiN) may provide reset current benefits or other benefits when deposited between third electrode material 135 (e.g., comprising carbon) and metal layer 405 (e.g., comprising tungsten, tantalum, or molybdenum).

Although not shown for clarity and ease of illustration, it will be understood that the illustrated array structures may be formed above or below other layers (e.g., over a substrate), which can include, among other things, various peripheral and supporting circuitry, and that the via 810 may couple the metal layer 405 or a structure formed therein with a structure at a higher or lower layer. For example, complementary metal oxide semiconductor (CMOS) transistors may be incorporated into column and row driver circuitry and sense amplifier circuitry, and the via 810 may couple an access line formed in metal layer 405 to a corresponding driver. In addition, the other layers may include one or more memory arrays, or "decks" of arrays—the structures illustrated in the examples of FIGS. 8-11 may correspond to one deck of a memory array and may be above or below any number of additional decks of the memory array.

Figure 12:
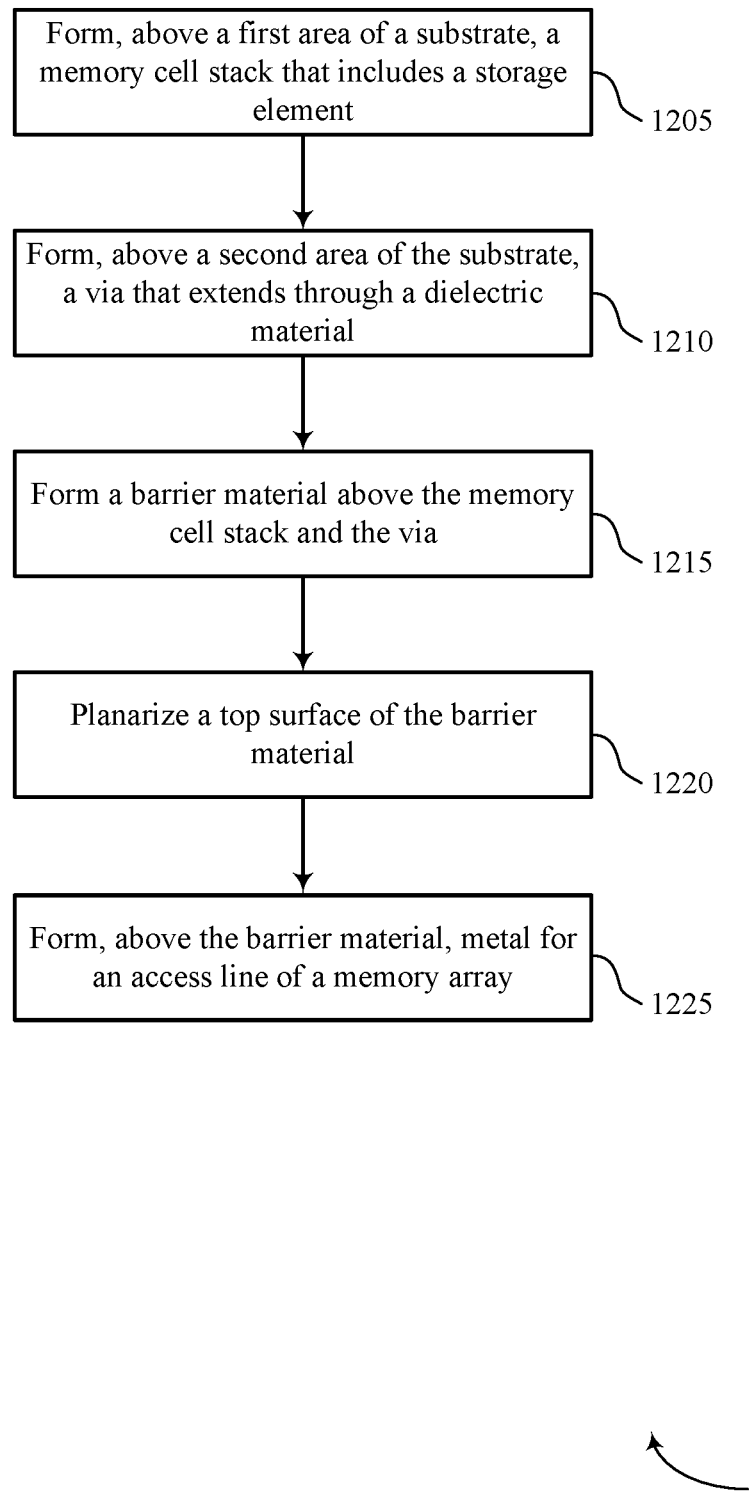
FIGS. 12-14 show flowcharts illustrating a method or methods that access line grain modulation in a memory device in accordance with examples as disclosed herein.

FIG. 12 shows a flowchart illustrating a method or methods 1200 of fabrication for a memory device in accordance with aspects of the present disclosure. The operations of method 1200 may be used to form a memory device or its components as described herein. For example, the operations of method 1200 may be implemented by the fabrication techniques as described with reference to FIGS. 8-11.

At 1205, a memory cell stack that includes a storage element may be formed above a first area of a substrate. The operations of 1205 may be performed according to the methods described herein. In some examples, aspects of the operations of 1205 may be performed using fabrication techniques as described with reference to FIGS. 8-11.

At 1210, a via that extends through a dielectric material may be formed above a second area of the substrate. The operations of 1210 may be performed according to the methods described herein. In some examples, aspects of the operations of 1210 may be performed using fabrication techniques as described with reference to FIGS. 8-11.

At 1215, a barrier material may be formed above the memory cell stack and the via. The operations of 1215 may be performed according to the methods described herein. In some examples, aspects of the operations of 1215 may be performed using fabrication techniques as described with reference to FIGS. 8-11.

At 1220, a top surface of the barrier material may be planarized. The operations of 1220 may be performed according to the methods described herein. In some examples, aspects of the operations of 1220 may be performed using fabrication techniques as described with reference to FIGS. 1-6.

At 1225, metal for an access line of a memory array may be formed above the barrier material. The operations of 1225 may be performed according to the methods described herein. In some examples, aspects of the operations of 1225 may be performed using fabrication techniques as described with reference to FIGS. 8-11.

In some examples, an apparatus as described herein may perform a method or methods, such as the method 1200. The apparatus may include features, means, or instructions (e.g., a non-transitory computer-readable medium storing instructions executable by a processor) for forming, above a first area of a substrate, a memory cell stack that includes a storage element, forming, above a second area of the substrate, a via that extends through a dielectric material, forming a barrier material above the memory cell stack and the via, planarizing a top surface of the barrier material, and forming, above the barrier material, metal for an access line of a memory array.

Some examples of the method 1200 and the apparatus described herein may further include operations, features, means, or instructions for removing, based at least in part on the planarizing, the barrier material from above the via. In some examples of the method 1200 and the apparatus described herein, the barrier material may remain above the memory cell stack after the planarizing. In some examples of the method 1200 and the apparatus described herein, the barrier material may remain on a sidewall of the via after the planarizing. In some examples of the method 1200 and the apparatus described herein, the barrier material may remain above the dielectric material after the planarizing.

Some examples of the method 1200 and the apparatus described herein may further include operations, features, means, or instructions for removing, based on the planarizing, the barrier material from above the via. In some examples of the method 1200 and the apparatus described herein, the barrier material remains above the memory cell stack after the planarizing. In some examples of the method 1200 and the apparatus described herein, the barrier material remains on a sidewall of the via after the planarizing. In some examples of the method 1200 and the apparatus described herein, the barrier material remains above the dielectric material after the planarizing.

Some examples of the method 1200 and the apparatus described herein may further include operations, features, means, or instructions for applying, before forming the barrier material, a first planarization process to a top surface of the dielectric material and a top surface of the via, where the top surface of the via may be protruded above the top surface of the dielectric material after the first planarization process. In some examples of the method 1200 and the apparatus described herein, the first planarization process removes the dielectric material at a faster rate than a material included in the via.

Some examples of the method 1200 and the apparatus described herein may further include operations, features, means, or instructions for forming an insulating region between the memory cell stack and a second memory cell stack, where the insulating region includes a second dielectric material, the memory cell stack includes an electrode, the first planarization process is applied to a top surface of the electrode and a top surface of the insulating region, and the first planarization process removes the second dielectric material at a faster rate than a material included in the electrode.

In some examples of the method 1200 and the apparatus described herein, the dielectric material and the second dielectric material may be different materials. In some examples of the method 1200 and the apparatus described herein, the metal may be in contact with a top surface of the via. In some examples of the method 1200 and the apparatus described herein, after the planarizing, the barrier material may have an undulating lower surface and a flat top surface. In some examples of the method 1200 and the apparatus described herein, the undulating lower surface may be conformal with one or more materials below the barrier material.

In some examples of the method 1200 and the apparatus described herein, planarizing the top surface of the barrier material may include operations, features, means, or instructions for applying a CMP process to the top surface of the barrier material.

Figure 13:
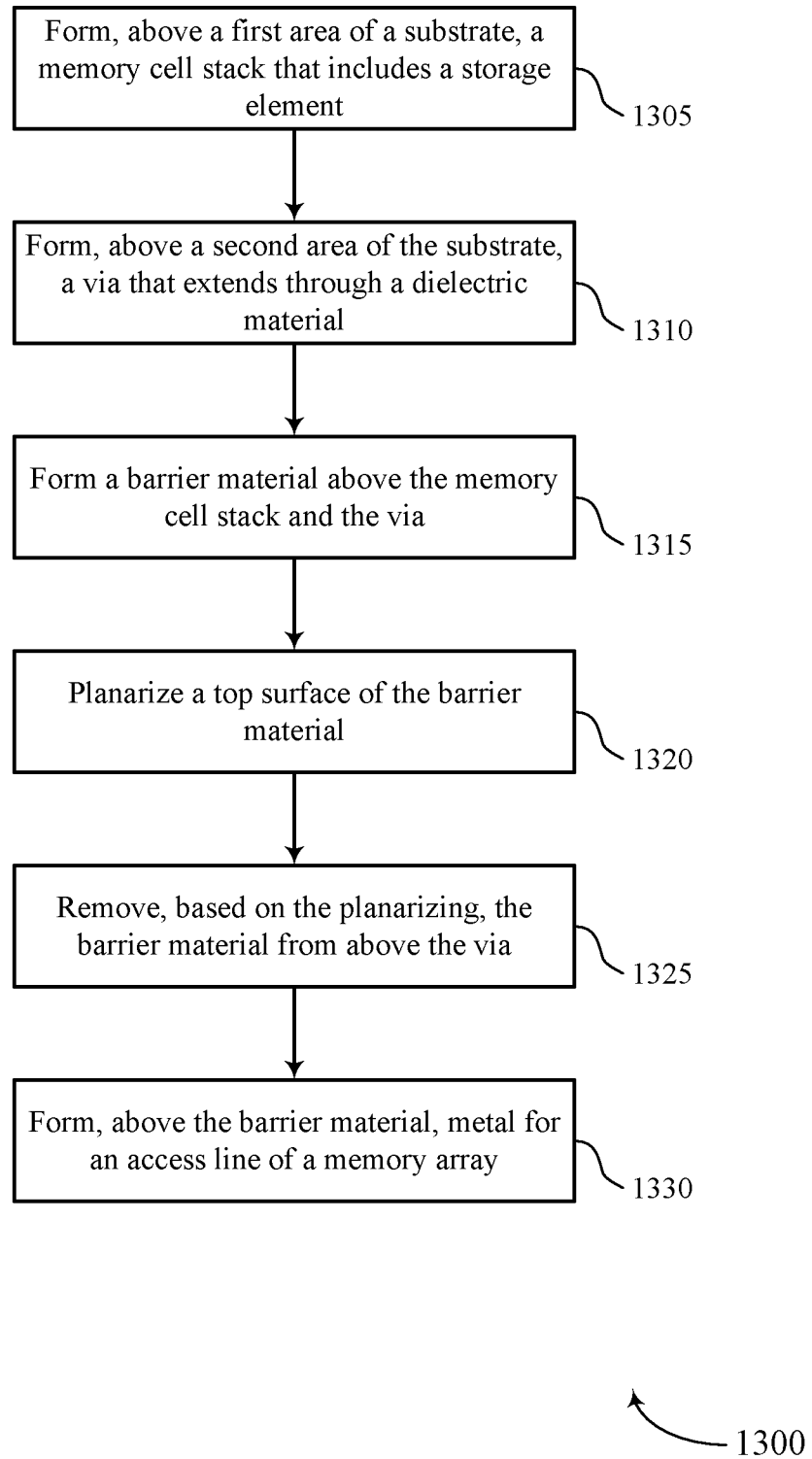

FIG. 13 shows a flowchart illustrating a method or methods 1300 of fabrication for a memory device in accordance with aspects of the present disclosure. The operations of method 1300 may be used to form a memory device or its components as described herein. For example, the operations of method 1300 may be implemented by the fabrication techniques as described with reference to FIGS. 8-11.

At 1305, a memory cell stack that includes a storage element may be formed above a first area of a substrate. The operations of 1305 may be performed according to the methods described herein. In some examples, aspects of the operations of 1305 may be performed using fabrication techniques as described with reference to FIGS. 8-11.

At 1310, a via that extends through a dielectric material may be formed above a second area of the substrate. The operations of 1310 may be performed according to the methods described herein. In some examples, aspects of the operations of 1310 may be performed using fabrication techniques as described with reference to FIGS. 8-11.

At 1315, a barrier material above the memory cell stack and the via may be formed. The operations of 1315 may be performed according to the methods described herein. In some examples, aspects of the operations of 1315 may be performed using fabrication techniques as described with reference to FIGS. 8-11.

At 1320, a top surface of the barrier material may be planarized. The operations of 1320 may be performed according to the methods described herein. In some examples, aspects of the operations of 1320 may be performed using fabrication techniques as described with reference to FIGS. 8-11.

At 1325, the barrier material from above the via may be removed based on the planarizing. The operations of 1325 may be performed according to the methods described herein. In some examples, aspects of the operations of 1325 may be performed using fabrication techniques as described with reference to FIGS. 8-11.

At 1330, a metal for an access line of a memory array may be formed above the barrier material. The operations of 1330 may be performed according to the methods described herein. In some examples, aspects of the operations of 1330 may be performed using fabrication techniques as described with reference to FIGS. 8-11.

Figure 14:
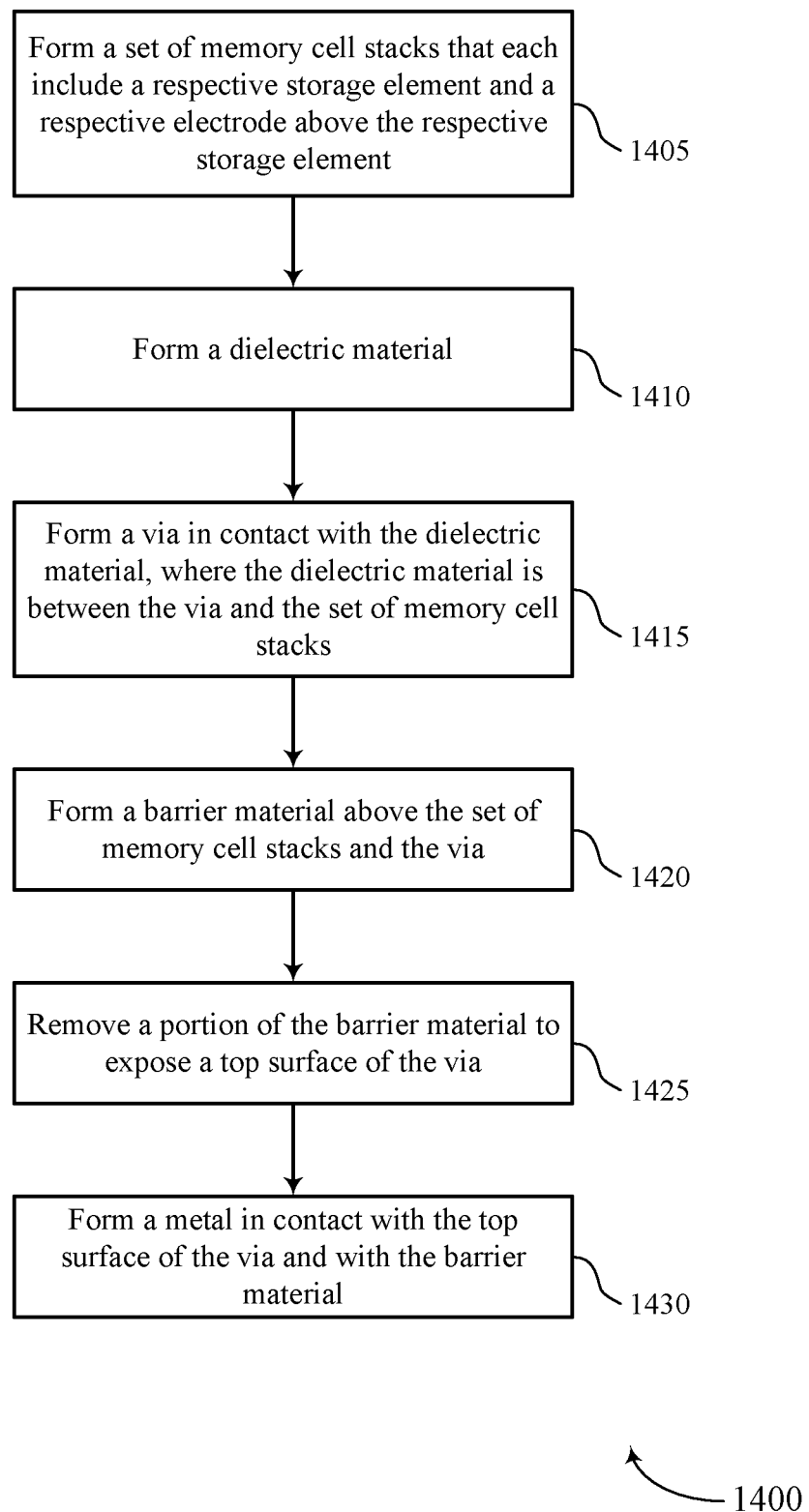

FIG. 14 shows a flowchart illustrating a method or methods 1400 of fabrication for a memory device in accordance with aspects of the present disclosure. The operations of method 1400 may be used to form a memory device or its components as described herein. For example, the operations of method 1400 may be implemented by the fabrication techniques as described with reference to FIGS. 8-11.

At 1405, a set of memory cell stacks that each include a respective storage element and a respective electrode above the respective storage element may be formed. The operations of 1405 may be performed according to the methods described herein. In some examples, aspects of the operations of 1405 may be performed using fabrication techniques as described with reference to FIGS. 8-11.

At 1410, a dielectric material may be formed. The operations of 1410 may be performed according to the methods described herein. In some examples, aspects of the operations of 1410 may be performed using fabrication techniques as described with reference to FIGS. 8-11.

At 1415, a via in contact with the dielectric material may be formed, where the dielectric material is between the via and the set of memory cell stacks. The operations of 1415 may be performed according to the methods described herein. In some examples, aspects of the operations of 1415 may be performed using fabrication techniques as described with reference to FIGS. 8-11.

At 1420, a barrier material may be formed above the set of memory cell stacks and the via. The operations of 1420 may be performed according to the methods described herein. In some examples, aspects of the operations of 1420 may be performed using fabrication techniques as described with reference to FIGS. 8-11.

At 1425, a portion of the barrier material may be removed to expose a top surface of the via. The operations of 1425 may be performed according to the methods described herein. In some examples, aspects of the operations of 1425 may be performed using fabrication techniques as described with reference to FIGS. 8-11.

At 1430, a metal may be formed in contact with the top surface of the via and with the barrier material. The operations of 1430 may be performed according to the methods described herein. In some examples, aspects of the operations of 1430 may be performed using fabrication techniques as described with reference to FIGS. 8-11.

In some examples, an apparatus as described herein may perform a method or methods, such as the method 1400. The apparatus may include features, means, or instructions (e.g., a non-transitory computer-readable medium storing instructions executable by a processor) for forming a set of memory cell stacks that each include a respective storage element and a respective electrode above the respective storage element, forming a dielectric material, forming a via in contact with the dielectric material, where the dielectric material is between the via and the set of memory cell stacks, forming a barrier material above the set of memory cell stacks and the via, removing a portion of the barrier material to expose a top surface of the via, and forming a metal in contact with the top surface of the via and with the barrier material.

In some examples of the method 1400 and the apparatus described herein, removing the portion of the barrier material may include operations, features, means, or instructions for polishing a top surface of the barrier material until the top surface of the via is exposed.

Some examples of the method 1400 and the apparatus described herein may further include operations, features, means, or instructions for polishing, before forming the barrier material, a top surface of the dielectric material until the via protrudes from the dielectric material.

It should be noted that the methods described herein are possible implementations, and that the operations and the steps may be rearranged or otherwise modified and that other implementations are possible. Furthermore, portions from two or more of the methods may be combined.

An apparatus is described. The apparatus may include a set of memory cell stacks that each include a respective storage element, a dielectric material disposed between the set of memory cell stacks and a via that extends through the dielectric material, a barrier material disposed above the set of memory cell stacks and the dielectric material, and an access line that extends from above the set of memory cell stacks to above the via, where the access line is in contact with a top surface of the barrier material and a top surface of the via.

In some examples, the barrier material may be in contact with a sidewall of the via. In some examples, the sidewall of the via extends above a top surface of the dielectric material. In some examples, a portion of the via may be surrounded by the barrier material. In some examples, the top surface of the barrier material may be flat and at least a portion of a bottom surface of the barrier material may be undulating. In some examples, the bottom surface of the barrier material may also be conformal with one or more materials below the barrier material.

In some examples, a memory cell stack of the set includes an electrode, and a portion of the electrode may be above a portion of the barrier material. Some examples of the apparatus may include a second dielectric material disposed between memory cell stacks of the set, where the barrier material may be in contact with the second dielectric material.

In some examples, the respective storage element includes a chalcogenide material. In some examples, the barrier material includes a nitride. In some examples, the barrier material includes tungsten silicon nitride, and the access line includes tungsten.

The term "layer" used herein refers to a stratum or sheet of a geometrical structure. Each layer may have three dimensions (e.g., height, width, and depth) and may cover some or all of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory arrays.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

As used herein, the term "substantially" means that the modified characteristic (e.g., a verb or adjective modified by the term substantially) need not be absolute but is close enough to achieve the advantages of the characteristic.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The term "exemplary" used herein means "serving as an example, instance, or illustration," and not "preferred" or "advantageous over other examples."

Chalcogenide materials may be materials or alloys that include at least one of the elements S, Se, and Te. Phase change materials discussed herein may be chalcogenide materials. Chalcogenide materials may include alloys of S, Se, Te, Ge, As, Al, Sb, Au, indium (In), gallium (Ga), tin (Sn), bismuth (Bi), palladium (Pd), cobalt (Co), oxygen (O), silver (Ag), nickel (Ni), or platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer. Other examples of variable resistance materials may include binary metal oxide materials or mixed valence oxide including two or more metals, e.g., transition metals, alkaline earth metals, and/or rare earth metals. Embodiments are not limited to a particular variable resistance material or materials associated with the memory elements of the memory cells. For example, other examples of variable resistance materials can be used to form memory elements and may include chalcogenide materials, colossal magnetoresistive materials, or polymer-based materials, among others.

The devices discussed herein may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The description set forth herein, in connection with the appended drawings, describes example configurations and does not represent all the examples that may be implemented or that are within the scope of the claims. The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
a plurality of memory cell stacks that each comprise a respective storage element;
a dielectric material disposed between the plurality of memory cell stacks and a via that extends through the dielectric material;
a barrier material disposed above the plurality of memory cell stacks and the dielectric material; and
an access line that extends from above the plurality of memory cell stacks to above the via, wherein the access line is in direct contact with a top surface of the barrier material and a top surface of the via.

2. The apparatus of claim 1, wherein the barrier material is in contact with a sidewall of the via.

3. The apparatus of claim 2, wherein the sidewall of the via extends above a top surface of the dielectric material.

4. The apparatus of claim 1, wherein a portion of the via is surrounded by the barrier material.

5. The apparatus of claim 1, wherein the top surface of the barrier material is flat and at least a portion of a bottom surface of the barrier material is conformal with one or more materials below the barrier material.

6. The apparatus of claim 1, wherein the top surface of the barrier material is flat and at least a portion of a bottom surface of the barrier material is undulating.

7. The apparatus of claim 1, wherein:
a memory cell stack of the plurality comprises an electrode; and
a portion of the electrode is above a portion of the barrier material.

8. The apparatus of claim 1, further comprising:
a second dielectric material disposed between memory cell stacks of the plurality, wherein the barrier material is in contact with the second dielectric material.

9. The apparatus of claim 1, wherein the respective storage element comprises a chalcogenide material.

10. The apparatus of claim 1, wherein the barrier material comprises a nitride.

11. The apparatus of claim 1, wherein:
the barrier material comprises tungsten silicon nitride; and
the access line comprises tungsten.

12. An apparatus, comprising:
a set of memory cell stacks;
a dielectric material disposed between the set of memory cell stacks and a via that extends through the dielectric material and protrudes above an uppermost surface of the dielectric material;
a barrier material disposed above the set of memory cell stacks and the dielectric material; and
an access line disposed above the barrier material, the access line coupled with the set of memory cell stacks and the via.

13. The apparatus of claim 12, wherein the access line is in contact with the barrier material and the via.

14. The apparatus of claim 12, further comprising:
a second dielectric material disposed between a first memory cell stack of the set and a second memory cell stack of the set.

15. The apparatus of claim 14, wherein a material of the dielectric material is different than a material of the second dielectric material.

16. The apparatus of claim 14, wherein the dielectric material and the second dielectric material comprise a same material.

17. An apparatus, comprising:
a memory cell stack;
a dielectric material between the memory cell stack and a via that extends through the dielectric material, wherein an uppermost surface of the via is above an uppermost surface of the dielectric material;
a barrier material above the memory cell stack and the dielectric material; and
an access line above the barrier material and coupled with the via.

18. The apparatus of claim 17, wherein the barrier material comprises a planarized top surface and an undulating bottom surface.

19. The apparatus of claim 17, wherein the access line is in contact with the uppermost surface of the via.

20. The apparatus of claim 17, wherein a portion of the via is surrounded by the dielectric material.

* * * * *